United States Patent
Sato et al.

(10) Patent No.: US 9,081,229 B2
(45) Date of Patent: Jul. 14, 2015

(54) SURFACE LIGHT SOURCE UNIT, SURFACE ILLUMINATION DEVICE, AND LIQUID CRYSTAL DISPLAY DEVICE

(75) Inventors: Eiichi Sato, Hachioji (JP); Hiroyasu Sato, Hachioji (JP); Ken Sato, Hachioji (JP)

(73) Assignee: OPTO DESIGN, INC. (JP)

( * ) Notice: Subject to any disclaimer, the term of this patent is extended or adjusted under 35 U.S.C. 154(b) by 433 days.

(21) Appl. No.: 13/509,766

(22) PCT Filed: Nov. 16, 2010

(86) PCT No.: PCT/JP2010/070409
§ 371 (c)(1),
(2), (4) Date: May 14, 2012

(87) PCT Pub. No.: WO2011/059100
PCT Pub. Date: May 19, 2011

(65) Prior Publication Data
US 2012/0268688 A1 Oct. 25, 2012

(30) Foreign Application Priority Data

Nov. 16, 2009 (JP) ................................. 2009-261372
Dec. 27, 2009 (JP) ................................. 2009-296547

(51) Int. Cl.
*F21V 13/02* (2006.01)
*G02F 1/1335* (2006.01)
(Continued)

(52) U.S. Cl.
CPC .... *G02F 1/133611* (2013.01); *G02F 1/133603* (2013.01); *G02F 1/133605* (2013.01);
(Continued)

(58) Field of Classification Search
CPC .................. G02F 1/133603; G02F 1/133604; G02F 1/133605; G02F 1/133606; G02F 1/133608; G02F 1133/611; F21V 13/02; F21V 13/10; F21V 13/12; F21V 11/12; F21V 11/14; H01L 25/0753; H01L 33/60
USPC ............... 362/97.3, 97.4, 241, 243, 245, 246, 362/247, 248, 307, 308
See application file for complete search history.

(56) References Cited

U.S. PATENT DOCUMENTS 8,742,435 B2 * 6/2014 Tanaka et al. .................... 257/98
2008/0198296 A1 * 8/2008 Chu et al. ....................... 362/612
(Continued)

FOREIGN PATENT DOCUMENTS

| CN | 101743431 A | 6/2010 |
| CN | 102472447 A | 5/2012 |

(Continued)

OTHER PUBLICATIONS

International Application Serial No. PCT/JP2010/070409, International Search Report mailed Dec. 14, 2010.
(Continued)

*Primary Examiner* — Y M Lee
(74) *Attorney, Agent, or Firm* — Schwegman Lundberg & Woessner, P.A.

(57) ABSTRACT

Provided is a surface light source unit which has a high-directivity point light source and has a decreased thickness in the in the direction in which light is irradiated from said point light source. Also provided are a surface illumination device and a liquid crystal display device. A plurality of small chambers (311 to 322) having an opening on the top are formed in a housing (3) from side plates (3b to 3e) that have a predetermined height and partition plates (4) which partition the inside of the housing (3). Each small chamber is provided with a point light source (2) on the bottom part. The opening of each small chamber (311 to 322) is covered with a light transmitting/reflecting plate (511 to 522) which has a surface area (S), and comprises: a central reflecting section that has a surface area (ΔS), exhibits high reflectance and low transmittance, and is positioned directly above the point light source (2); and an outer reflecting section that surrounds the central reflecting section and is configured so that the light transmittance increases at distances further from the central reflecting section. The surface area (ΔS) and surface area (S) of each light transmitting/reflecting plate (511 to 522) are set in a manner such that the ratio ΔS/S is a predetermined value.

22 Claims, 26 Drawing Sheets

(51) Int. Cl.
  *F21V 11/12* (2006.01)
  *F21V 11/14* (2006.01)
  *H01L 25/075* (2006.01)
  *H01L 33/60* (2010.01)

(52) U.S. Cl.
  CPC .... *G02F1/133606* (2013.01); *G02F 1/133608* (2013.01); *F21V 11/12* (2013.01); *F21V 11/14* (2013.01); *H01L 25/0753* (2013.01); *H01L 33/60* (2013.01); *H01L 2924/0002* (2013.01)

(56) References Cited

U.S. PATENT DOCUMENTS

| | | |
|---|---|---|
| 2008/0284942 A1 | 11/2008 | Mahama et al. |
| 2010/0177535 A1 | 7/2010 | Sato et al. |
| 2012/0105739 A1 | 5/2012 | Shimizu |
| 2012/0188759 A1 | 7/2012 | Sato et al. |

FOREIGN PATENT DOCUMENTS

| CN | 102549334 A | 7/2012 |
|---|---|---|
| EP | 2138753 A1 | 12/2009 |
| EP | 2163807 A1 | 3/2010 |
| EP | 2204603 A1 | 7/2010 |
| EP | 2439442 A1 | 4/2012 |
| EP | 2484963 A1 | 8/2012 |
| JO | 2005-352426 A | 12/2005 |
| JP | 2006-58481 A | 3/2006 |
| JP | 2006-208466 A | 8/2006 |
| JP | 2006310640 A | 11/2006 |
| JP | 2006330659 A | 12/2006 |
| JP | 2007-286627 A | 11/2007 |
| JP | 2008-27886 A | 2/2008 |
| JP | 2009004248 A | 1/2009 |
| JP | 2009-31617 A | 2/2009 |
| JP | 2009-63683 A | 3/2009 |
| JP | 2009-110696 A | 5/2009 |
| JP | 2009-157115 A | 7/2009 |
| JP | 2009-258285 A | 11/2009 |
| JP | 2011076987 A | 4/2011 |
| JP | 4764962 B2 | 9/2011 |
| JP | 4788231 B2 | 10/2011 |
| KR | 20100009585 A | 1/2010 |
| TW | 200914770 A | 4/2009 |
| WO | WO-2008114882 A1 | 9/2008 |
| WO | WO-2009001532 A1 | 12/2008 |
| WO | WO-2011010488 A1 | 1/2011 |
| WO | WO-2011040493 A1 | 4/2011 |

OTHER PUBLICATIONS

International Application Serial No. PCT/JP2010/070409, International Preliminary Report on Patentability mailed May 31, 2012, (w/ English Translation), 13 pgs.
International Application Serial No. PCT/JP2010/070409, Written Opinion mailed Dec. 14, 2010, (w/ English Translation), 11 pgs.
European Application Serial No. 10830056.7, European Search Report mailed Jul. 5, 2013, 16 pgs.

\* cited by examiner

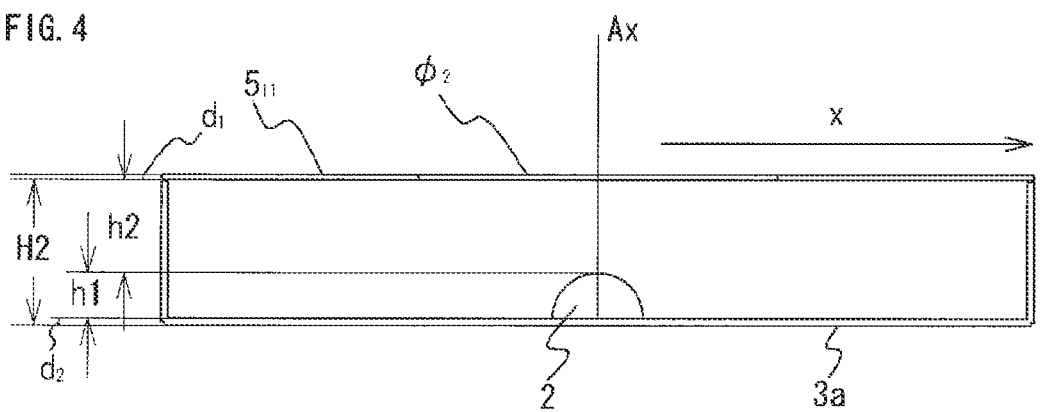

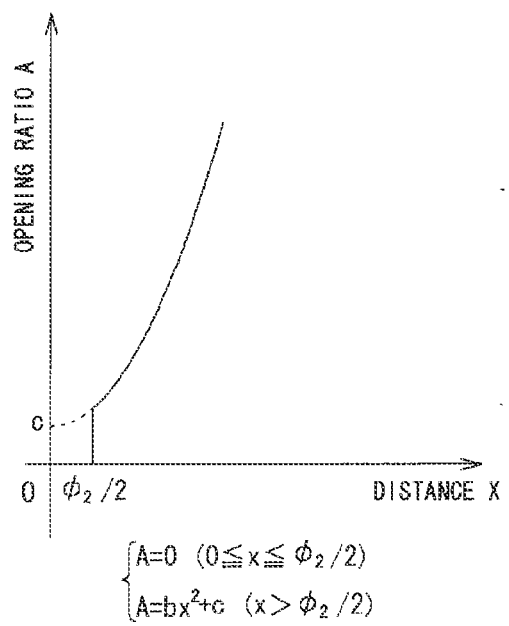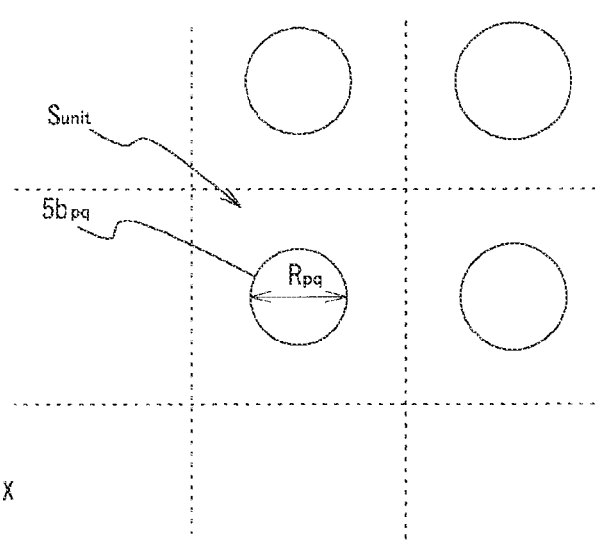

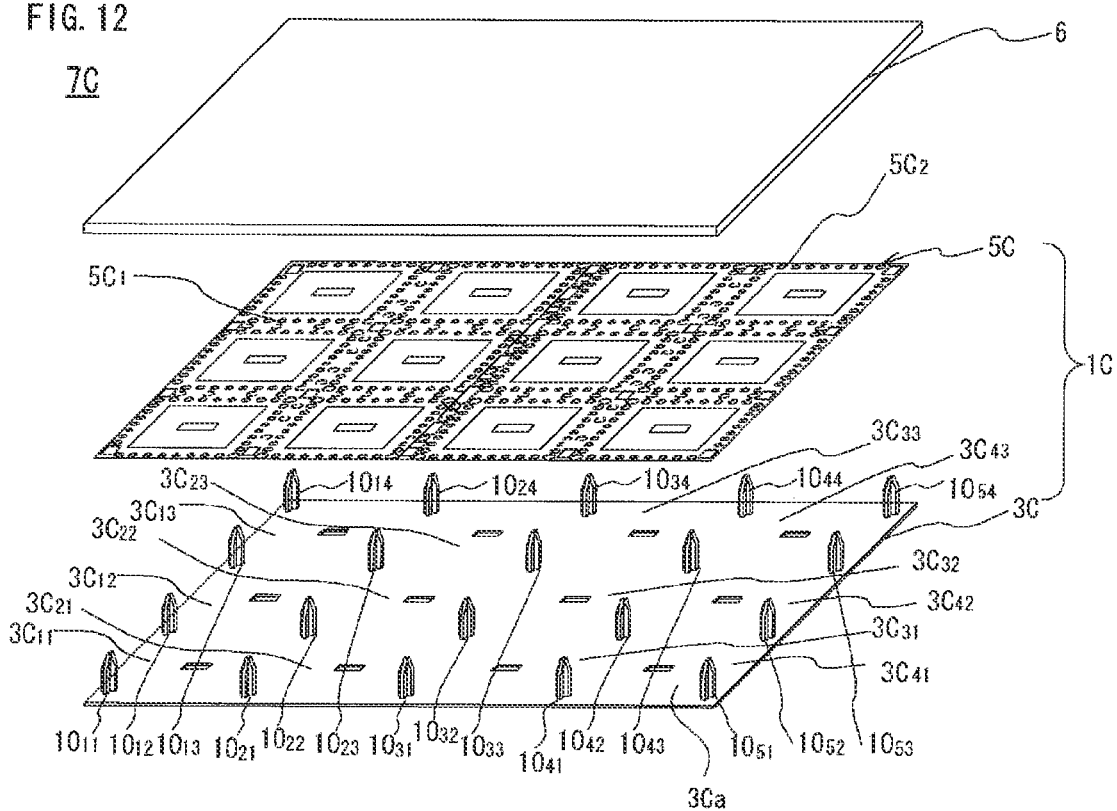

US 9,081,229 B2

SURFACE LIGHT SOURCE UNIT, SURFACE ILLUMINATION DEVICE, AND LIQUID CRYSTAL DISPLAY DEVICE

RELATED APPLICATIONS

This application is a nationalization under 35 U.S.C. 371 of PCT/JP2010/070409,filed Nov. 16, 2010, and published as WO 2011/059100 A1 on May 19, 2011, which claims priority to Japanese Patent Application Serial No. 2009-261372, filed Nov. 16, 2009 and Japanese Patent Application Serial No. 2009-296547, filed Dec. 27, 2009 which applications and publication are incorporated herein by reference in their entirety.

TECHNICAL FIELD

The present invention relates to a surface light source unit, a surface illumination device, and a liquid crystal display device. It particularly relates to a surface light source unit that includes a point light source that has high directivity, converts point light from the point light source into surface light of a predetermined area, and radiates the surface light, and to a surface illumination device and a liquid crystal display device that include the surface light source unit.

BACKGROUND ART

Recently, studies and developments on light emitting diodes (hereinafter referred to as "LEDs") have rapidly advanced, and various types of LEDs have been developed and commercialized to be used in a wide range of fields, while the use of LEDs in the field of lighting is becoming increasingly popular. In the field of lighting, LEDs are used not only as a substitute for fluorescent lights and light bulbs but also for, for example, backlights for liquid crystal display panels and the like.

For example, the backlights for liquid crystal display panels are roughly classified into an edge-light type in which a light source such as a cathode ray tube or an LED is disposed on one side portion of a light guide plate to illuminate a plane part of the light guide plate, and a direct type in which light sources of a similar kind and a diffusing plate are disposed facing each other with a predetermined distance therebetween, and these light sources directly radiate light onto the diffusing plate to illuminate a diffusing plate surface. The edge-light type backlight requires an expensive light guide plate. Thus, to obtain a large light emitting surface, a large light guide plate is required which leads to a heavier weight and a higher cost. Furthermore, when such a large light guide plate is used, the light path between the light source and a light emitting surface is long and thus, light is largely attenuated. Therefore, a problem exists in that uniform illumination is difficult to obtain.

By contrast, the direct type backlight, which requires no light guide plate, has a problem in that when a point light, source, e.g., an LED, is used as the light source, uniform surface light is difficult to obtain based on the light from the LED. Thus, direct type backlights, with each using an LED, designed to solve the problem are proposed (see, for example, Patent Documents 1 to 3 listed below).

FIG. 25 illustrates the direct-type backlight using the LED described in Patent Document 1 listed below. FIG. 25A is a perspective view of a backlight portion in which an inner portion can be seen through. FIG. 25B is a partial cross-sectional view of FIG. 25A.

A backlight box described in Patent Document 1 listed below is disposed on a rear surface of an unillustrated color liquid crystal display panel and illuminates the liquid crystal display panel from the rear surface. The backlight box includes a box portion 20 provided with an opening through which light from an LED unit described later is emitted outside, and a transmitting/diffusing plate 26 provided over an opening 20a of the box portion 20 in the box portion 20, red LEDs 21R, green LEDs 21G, and blue LEDs 21B are used as light sources. The LEDs are linearly arranged in a predetermined order to form the LED unit.

A casing 23 of the box portion 20 includes inner surfaces including a reflective surface 24. In the casing 23, a transmitting/reflecting plate 25 in parallel with the opening portion 20a is provided at an intermediate portion in such a manner as to cover the LED units. The transmitting/reflecting plate 25 has a function of partly transmitting incident light and partly reflecting the incident light. In the backlight box, a part of the light of each color emitted from the LED unit does not directly transmit through the transmitting/reflecting plate 25. Instead, a part of light transmits through the transmitting/reflecting plate 25 after being subjected to internal reflection for a plurality of times between the reflective surface 24 and the transmitting/reflecting plate 25 in a space closed by the transmitting/reflecting plate 25. As a result, the radiation area of light incident on a transmitting/diffusing plate 26 is increased and desired white light can be obtained with an unevenness in color and brightness reduced. Furthermore, the box casing has a height (thickness) reduced to 2 cm to 5 cm from 8 cm to 10 cm in a conventional technique.

Patent Document 2 listed below describes a direct type backlight in which partition walls having a height of 5 mm to 25 mm disposed among a plurality of LEDs are provided to a configuration similar to that of the backlight described in Patent Document 1 listed below to reduce loss of light. The partition walls are not tall enough to reach the diffusing plate.

Patent Document 3 listed below describes surface lighting light source device including: a box-shaped casing having an upper portion opened and being provided with an LED on a bottom plate; and a light transmitting/reflecting plate covering the opening of the casing and having a central reflecting section at a portion directly above the LED and an outer reflecting section provided at the periphery of the central reflecting section. It should be noted that Patent Document 3 is a publication of a patent application related to the applicant of the present application.

FIG. 26 illustrates the surface lighting light source device described in Patent Document 3 listed below. FIG. 26A is a schematic perspective view. FIG. 26B is a cross-sectional view taken along the line XXVIB-XXVIB in FIG. 26A.

This surface lighting light source device 30 includes: an LED 33; a housing 31 including a square bottom plate 31a in which the LED is disposed at a center portion and side walls 31b to 31e each standing to a predetermined height from the periphery of the bottom plate, having an upper portion opened, and having an inner wall surface formed of a reflective surface; and a light transmitting/reflecting plate 32 that covers an opening 31f of the housing 31. The light transmitting/reflecting plate 32 is divided into a central reflecting section 32a at a portion directly above the LED 33 and an outer reflecting section 32b on the outer periphery of the central reflecting section, and is formed of a material having predetermined reflectance and transmittance.

The central reflecting section 32a is a circular region having a predetermined radius (diameter $\phi_1$) from a point where the light transmitting/reflecting plate 32 intersects with a light axis Ax of the LED 33. The surface lighting light source device 30 is assembled by: disposing the LED 33 substantially at the center of the bottom plate 31a of the housing 31; covering the opening 31f of the housing with the light transmitting/reflecting plate 32; and fixing the light transmitting/reflecting plate 32 to the periphery of the opening. As illustrated in FIG. 26B, the height of the thus assembled surface lighting light source device 30 is equal to the protruding height H1 of the LED 33 from the surface of the bottom plate 31a.

The dimensions of the surface lighting light source device 30 is as follows with the length of one side of the bottom plate 31a of the housing represented by $L_1$, the height of the side plates 31b to 31e of the housing represented by H1, the length of one side of the light transmitting/reflecting plate 32 represented by $L_1$, the thickness of the light transmitting/reflecting plate 32 represented by $D_1$, the diameter of the central reflecting section 33a represented by $\phi_1$, the height of the LED 33 represented by $h_1$, and the height from the LED 33 to the central reflecting section 32a represented by $h_2$. Specifically, $L_1$ and of the housing 31 is 100 mm and H1 is 15 mm. $L_1$ of the light transmitting/reflecting plate is 100 mm and the thickness $D_1$ is 1.0 mm. The diameter $\phi_1$ is 10 mm, $h_1$ is 1 mm, and $h_2$, is 13 mm.

The thickness of the bottom plate 31a of the housing 31 is 1.0 mm. H1 is the sum of $h_1$ and $h_2$. An area S of the light, transmitting/reflecting plate 32 and an area $\Delta S1$ of the central reflecting section 32a are calculated as follows on the basis of the dimensions. Specifically, S is $L_1 \times L_1$, i.e., 100 mm×100 mm, whereas $\Delta S1$ is $\pi \times (\frac{1}{2} \times \phi_1)^2$, i.e., $\pi \times 5^2$ (mm$^2$). An area ratio $\Delta S1/S1$ of the area $\Delta S1$ of the central reflecting section 32a to the area S of the light transmitting/reflecting plate 32 and is 0.78%.

CITATION LIST

Patent Documents

[Patent Document 1] JP-A-2005-352426 (paragraphs [0042] to [0045], and [0085], FIG. 7)
[Patent Document 2] JP-A-2007-286627 (paragraphs [0024] and [0025], FIG. 5)
[Patent Document 3] JP-A-2008-27886 (paragraphs [0049] and [0064], FIG. 1 and FIG. 4)

DISCLOSURE OF INVENTION

Problem to be Solved by the Invention

Liquid crystal display devices are widely used mainly for display devices for images and the like typically in a mobile terminal, a display of a computer, or a television device, and the use is further expanding. Along with such an expansion of use, the backlight is facing various demands including further reduction in thickness and improvement of lighting quality.

The backlights described in Patent Documents 1 and 2 listed above satisfy the demand for a reduction in thickness. Specifically, with the transmitting/reflecting plate provided, the backlight described in Patent Document 1 listed above has a thickness reduced to about 2 cm to 5 cm from about 8 cm to 10 cm in the conventional technique. The thickness of the backlight shown in Patent Document 2 listed above, which is not specifically disclosed, is estimated to be slightly smaller than or substantially the same as the thickness of the backlight of Patent Document 1 listed above because the height of a partition plate is 5 mm to 25 mm. The surface lighting light source device of Patent Document 3 listed above, which can be used as a backlight, includes a casing having a height of 15 mm.

Recently, backlights have been demanded to be even thinner, and specifically to have the thickness reduced to be not more than 10 mm. However, such a reduction in thickness is difficult to achieve because the thinning technique employed in the backlights of Patent Documents 1 to 3 have the following problems. Specifically, Problem 1 is as follows. The backlights described in Patent Documents 1 and 2 listed above use the LED unit including red, green, and blue LEDs, as the light source and mix the light beams from the LEDs of the various colors to obtain white light. Thus, a certain distance for mixing the colors needs to be provided between the casing bottom surface on which the LED is fixed and the transmitting/reflecting plate or the diffusing plate. Accordingly, a reduction in thickness is difficult to achieve.

Problem 2 is as follows. In the backlights, particularly in the backlight described in Patent Document 1 listed above, a plurality of LEDs are disposed in a single box casing. Thus, the light beams from the LEDs interfere with each other in a complex manner, and thus uniform surface illumination light is difficult to obtain. The backlight described in Patent Document 2 listed above includes the partition walls, but has the same problem because the partition walls are short in height.

Problem 3 is as follows. In these backlights, a portion of the diffusing plate directly above the LED may be bright and thus uneven brightness may occur. Problem 4 is as follows. In the backlights described in Patent Documents 1 to 3 listed above, the distance between the casing bottom surface on which the LED is fixed and the transmitting/reflecting plate or the diffusing plate is large and thus the emission distance of light is long. Accordingly, loss of light occurs as it gets farther from the light source, and thus uniform illumination light cannot be obtained. Recently, a white LED has been developed and commercialized that is a single LED emitting white light. However, these problems cannot be solved even when the white LED is used as an LED for the backlights.

The inventors thought that the problems would be solved by downsizing the large backlight without any changes while maintaining its shape, for example, and thus made an attempt to reduce the thickness by making the large backlight to be half and quarter of the original size only to find out that such an attempt failed to solve the problems described above. Thus, the inventors advanced the development through trial and error, and found out that the problems could be solved by adjusting the size of the central reflecting section in the light transmitting/reflecting plate described in Patent Document 3 listed above, and have completed this invention based on this finding.

Specifically, the present invention provides a surface light source unit and surface illumination device that, while using a point light source having high directivity as a light source, can achieve a reduction in thickness in the direction in which light is emitted from the point light source to reduce the thickness of the surface light source unit to a range from 10 mm to 2 mm, particularly to a range from 5 mm to 2 mm, can have small unevenness in brightness and loss of light to obtain uniform illumination light, and can reduce the number of parts to facilitate assembly.

The present invention also provides a liquid crystal display device that uses the surface light source unit or the surface illumination device as a backlight.

Means for Solving Problem

A surface light source unit of the present invention for solving the above problems includes: a plurality of point, light sources; a bottom plate provided with the point light sources; and a light transmitting/reflecting plate disposed apart from the bottom plate with a predetermined distance therebetween.

The point light sources are each arranged at the center portion of a position corresponding to one of a plurality of small chamber corresponding positions in the bottom plate.

The light transmitting/reflecting plate includes a mini-light transmitting/reflecting plate region provided at each of the small chamber corresponding positions, having an area S, and including a central reflecting section disposed at a portion directly above the corresponding point light source and having high light reflectance, low light transmittance, and an area $\Delta S$, and an outer reflecting section disposed on the periphery of the central reflecting section and having light transmittance increasing along with a distance from the central reflecting section.

The mini-light transmitting/reflecting plate region has a ratio $\Delta S/S$ of the area $\Delta S$ to the area S set to a predetermined value corresponding to the size of the area S.

In the surface light source unit of the present invention, the thickness in the radiation direction in which light is emitted from the point light source, i.e., the thickness of the surface light source unit, can be dramatically reduced from that in the conventional technique. Furthermore, glare and loss of light can be prevented so that light with substantially uniform illumination can be obtained.

In the surface light source unit of the present invention, it is preferable that the ratio $\Delta S/S$ of the area $\Delta S$ to the area S be set to be small when the predetermined distance is large, and be set to be large when the predetermined distance is small. It is preferable that the predetermined distance range from 2 mm to 10 mm, and the ratio $\Delta S/S$ of the area $\Delta S$ to the area S range from 5% to 15%.

In the surface light source unit of the present invention, the thickness of the surface light source unit can be reduced in particular, and furthermore, the glare and light loss can be prevented so that substantially uniform illumination light can be obtained.

In the surface light source unit of the present invention, a pillar having a height equal to the predetermined distance may be formed on the bottom plate, and the light transmitting/reflecting plate may be fixed on a distal end portion of the pillar.

In the surface light source unit of the present invention, a desired distance can be provided between the bottom plate and the light transmitting/reflecting plate only by fixing the light transmitting/reflecting plate on the pillar. Thus, the surface light source unit can be easily manufactured.

In the surface light source unit of the present invention, a pillar having a height larger than the predetermined distance may be formed on the bottom plate. The light transmitting/reflecting plate may be fixed to the pillar in such a manner that a distal end of the pillar protrudes to a certain height from the light transmitting/reflecting plate.

In the surface light source device of the present invention, a predetermined distance can be provided between the bottom plate and the light transmitting/reflecting plate by fitting the light transmitting/reflecting plate to the pillar. Thus, the surface light source device can be easily manufactured. Furthermore, the distal end portion of the pillar protrudes to a certain height from a front surface of the light transmitting/reflecting plate. Thus, when the surface light source unit and the diffusing plate are combined to form a surface light source device, the diffusing plate can be more easily fixed.

In the surface light source unit of the present invention, the pillar may have a spire cross shape, a tapered frustum shape, a pillar with a wire shaped protrusion, a cylindrical shape with a semispherical end, or a cylindrical shape with a semispherical end and window.

In the surface light source unit of the present invention, a distal end portion of the pillar is thin and a base portion of the pillar is thick. Thus, a desired distance can be easily provided between the bottom plate and the light transmitting/reflecting plate by appropriately selecting the thickness of the pillar and the diameter of an opening for fixing.

In the surface light source unit of the present invention, the pillar may be formed of a transparent material and may have a cylindrical shape with a semispherical end or a cylindrical shape with a semispherical end and window, and the point light source may be disposed inside the cylindrical portion.

In the surface light source unit of the present invention, the pillar can be disposed to surround the periphery of the point light source. Thus, the same distance between the point light source and the light transmitting/reflecting plate can be secured in particular. Thus, more uniform illumination light can be obtained.

In the surface light source unit of the present invention, it is preferable that a slit penetrating the light transmitting/reflecting plate be formed on the outer reflecting section.

In the surface light source unit of the present invention, the opening provided in the outer reflecting section is in a form of the slit, and thus an opening ratio can be increased. Accordingly, the amount of light absorbed by the light transmitting/reflecting plate can be reduced and thus, light emitted from the point light source can be more efficiently used.

In the surface light source unit of the present invention, it is preferable that a minute hole smaller than the point, light source be provided in the central reflecting section.

In the surface light, source unit of the present invention, an amount of light that transmits through the light transmitting/reflecting plate is reduced, and thus the spectrum of light does not fluctuate. Accordingly, the illumination light can have a uniform color temperature.

In the surface light source unit of the present invention, it is preferable that a high light reflectance member be attached on the point light source side in the central reflecting section.

In the surface light source unit of the present invention, the amount of light that transmits through the light transmitting/reflecting plate can be further reduced. Thus, the spectrum of light does not fluctuate. Accordingly, the illumination light can have a uniform color temperature.

In the surface light source unit of the present invention, it is preferable that a diffusion member or a micro-lens that diffuses light be provided in the opening or the slit.

In the surface light source unit of the present invention, the fluctuation in the spectrum of light is uniform and thus, the illumination light can have a uniform color temperature. Furthermore, brightness can also be made uniform.

In the surface light source unit of the present invention, the light transmitting/reflecting plate may be divided into pieces having a size large enough to cover the small chamber portions adjacent to each other.

In the surface light source unit of the present invention, the light transmitting/reflecting plate needs to be provided for each set of a plurality of small chamber portions. Thus, the surface light source unit can be more easily manufactured compared with a case where the light transmitting/reflecting plate is provided for each of the small chamber portions.

In the surface light source unit of the present invention, at least one of either the bottom plate or the light transmitting/reflecting plate may be formed of an ultrafinely foamed light reflective material.

The ultrafinely foamed light reflective material has high light reflectance and low light transmittance. In the surface light, source unit of the present invention, at least one of either the bottom plate or the light transmitting/reflecting plate is formed of the ultrafinely foamed light reflective material. Thus, the loss of light from the light source can be further reduced, and furthermore, uniform illumination light can be obtained.

In the surface light source unit of the present invention, the ultrafinely foamed light reflective material may be provided with a flame retardant coating.

In the surface light source unit of the present invention, the light transmitting/reflecting plate, the housing, and the partition each formed of the ultrafinely foamed light reflective material having low heat resistance are coated by a flame retardant to have flame resistance. Thus, a flame retardant surface illumination device can be manufactured at a low cost.

In the surface lighting unit of the present invention, it is preferable that the flame retardant coating be formed of paraxylylene or polyethylene terephthalate.

In the surface light source unit of the present invention, flame retardant surface illumination devices can be mass-produced at a low cost because the paraxylylene or the polyethylene terephthalate can cover a large number of surfaces of the ultrafinely foamed light reflective materials by vacuum deposition and the like. Particularly, the paraxylylene has little influence on light absorptivity and the like, and thus can improve not only the flame resistance of the surface illumination device but can also prevent the reduction of light use efficiency due to the use of the diffusing plate.

In the surface light source unit of the present invention, the bottom plate may be divided into small chamber portions having the same size by a partition plate, and the mini-light transmitting/reflecting plate region may have the size same as that of each of the small chamber portions.

In the surface light source unit of the present invention, the desired distance can be easily provided between the bottom plate and the light transmitting/reflecting plate by maintaining the height of the partition at a predetermined value. In addition, the housing may be formed to surround the periphery of the surface light source unit by utilizing the bottom plate.

In the surface light, source unit of the present invention, the partition plate may be shorter in height than the side wall.

With the surface light source unit of the present invention, light can pass through the small chambers, and thus the use efficiency of light can be improved.

In the surface light, source unit of the present invention, the bottom plate and the partition plate may be joined by a quadric surface having a focus point on the point light source side.

With the surface light source unit of the present invention, no reflected light is directed toward the joined portion between the bottom plate and the partition plate, and emitted light is radiated entirely. Thus, use efficiency of light can be improved.

In the surface light source unit of the present invention, it is preferable that a light transmission hole or a notch groove through which light passes be provided on at least one of either the light transmitting/reflecting plate or the partition plate at a portion at which the light transmitting/reflecting plate and the partition plate are in contact with each other, or at a portion near the portion in contact thereof.

In the surface light source unit of the present invention, the light transmission hole or the notch groove is provided at a portion at which the light transmitting/reflecting plate and the partition plate are in contact with each other or at a portion near the portion in contact. Thus, a portion around the boundary between the adjacent small chamber portions can be prevented from being dark.

In the surface light source unit of the present invention, at least one of either the bottom plate, the partition plate, or the light transmitting/reflecting plate may be formed of an ultrafinely foamed light reflective material.

In the surface light source unit of the present invention, at least one of either the bottom plate, the partition plate, or the light transmitting/reflecting plate is formed of the ultrafinely foamed light reflective material. Thus, the loss of light from the light source can be further reduced, and the uniform illumination light can be obtained.

In the surface light source unit of the present invention, the ultrafinely foamed light reflective material forming at least one of either the bottom plate, the partition plate, or the light transmitting/reflecting plate may be provided with a flame retardant coating.

In the surface light source unit of the present invention, the light transmitting/reflecting plate, the housing, and the partition wall each formed of the ultrafinely foamed light reflective material having low heat resistance are coated by the flame retardant to have flame resistance. Thus, a flame retardant surface illumination device can be manufactured at a low cost.

In the surface lighting unit of the present invention, it is preferable that the flame retardant coating for coating the ultrafinely foamed light reflective material forming at least one of either the bottom plate, the partition plate, or the light transmitting/reflecting plate be formed of paraxylylene or polyethylene terephthalate.

With the surface light source unit of the present invention, flame retardant surface illumination devices can be mass-produced because the paraxylylene or the polyethylene terephthalate can cover a large number of surfaces of the ultrafinely foamed light reflective materials forming at least one of either the bottom plate, the partition plate, or the light transmitting/reflecting plate by vacuum deposition and the like. Thus, flame retardant surface illumination devices can be mass-produced at a low cost. Particularly, the paraxylylene has little influence on light absorptivity and the like, and thus can improve not only the flame resistance of the surface illumination device but can also prevent die reduction of light use efficiency due to the use of the diffusing plate.

To further achieve the above-described objectives, a surface illumination device of the present invention includes a single unit or a plurality of units connected to each other of any one of the surface light source units described above.

With the surface illumination device of the present invention, a surface illumination device that has a reduced thickness and emits surface light of a desired area can be provided.

In the surface illumination device of the present invention, it is preferable that a diffusing plate that transmits light be disposed above a light emitting surface of the light transmitting/reflecting plate.

In the surface illumination device of the present invention, the diffusing plate that transmits light is disposed above the light emitting surface of the light transmitting/reflecting plate. Thus, a surface illumination device that emits more uniform light can be obtained.

In the surface illumination device of the present invention, it is preferable that the diffusing plate have flame resistance.

With the surface illumination device of the present invention, even when heat caused by fire and the like melts an ultrafinely foamed light reflecting plate inside, the molten material does not leak out as long as the diffusing plate does not break. Thus, flame resistance of the surface illumination device can be improved.

Furthermore, to achieve the objectives, a liquid crystal display device of the present invention includes any one of the surface illumination devices described above provided on a rear surface of a liquid crystal display panel.

In the liquid crystal display device of the present invention, a surface illumination device of a direct type using a point light source has a reduced thickness. Thus, a liquid crystal display device using the surface illumination device as a backlight can also have a reduced thickness.

BRIEF DESCRIPTION OF DRAWINGS

FIG. 1 illustrates a surface light source unit according to a first embodiment of the present invention, FIG. 1A being a schematic diagram of the surface light source unit and FIG. 1B being a cross-sectional view taken along the line IB-IB in FIG. 1A.

FIG. 2 is a perspective view of one of the cell light sources in the surface light source unit in FIG. 1.

FIG. 3 is an exploded perspective view of the cell light source in FIG. 2.

[FIG. 4] FIG. 4 is a cross-sectional view of the cell light source taken along the line IV-IV in FIG. 2.

[FIG. 5] FIG. 5A is a diagram illustrating an opening ratio curve of an opening provided in a light transmitting/reflecting plate in FIG. 2. FIG. 5B is an enlarged view of openings provided in the light transmitting/reflecting plate.

FIG. 6 illustrates a surface light source unit according to a second embodiment of the present invention, FIG. 6A being a schematic diagram of the surface light source unit and FIG. 6B being a cross-sectional view taken along the line VIB-VIB in FIG. 6A.

FIG. 7 is a perspective view of one of cell light sources in the surface light source unit in FIG. 6.

FIG. 8 illustrates relationships between the height of a surface light source unit and an area of a central reflecting section, FIG. 8A to 8C being cross-sectional views of a surface light source unit.

FIG. 9 is an exploded perspective view of a surface lighting illumination and a liquid display device according to an embodiment of the present invention.

FIG. 10 is an exploded perspective view of a surface light source unit according to a third embodiment of the present invention.

FIG. 11 is a perspective view of a surface illumination device according to a fourth embodiment of the present invention.

[FIG. 12] FIG. 12 is an exploded perspective view of the surface illumination device in FIG. 11.

FIG. 13 illustrates modifications of pillar in FIG. 11.

FIG. 14 is an exploded perspective view of a surface illumination device according to a fifth embodiment of the present invention.

FIG. 15 is a perspective view of the surface illumination device in FIG. 14.

FIG. 16 is a cross-sectional view taken along the line XVI-XVI in FIG. 14.

FIG. 17 is a cross-sectional view of a surface illumination device according to a sixth embodiment of the present invention.

[FIG. 18]

FIG. 19 is a schematic diagram illustrating an example of flame retardant processing for a light transmitting/reflecting plate in FIG. 18.

FIG. 20 is a schematic diagram showing another example of the flame retardant processing for the light transmitting/reflecting plate in FIG. 18.

FIG. 21 illustrates a light transmitting/reflecting plate of a surface light source unit according to an eighth embodiment of the present invention, FIG. 21A being a plan view of the light transmitting/reflecting plate, FIG. 21B and FIG. 21C being plan views of other examples of the light transmitting/reflecting plate, and FIG. 21D being a cross-sectional view taken along the line XXID-XXID in FIG. 21A.

FIG. 22 is a cross-sectional view of a surface light source unit according to a ninth embodiment of the present invention.

FIG. 23 illustrates a modification of an exploded perspective view of a surface light source unit according to a third embodiment of the present invention.

FIG. 24 illustrates another example of the modification of the exploded perspective view of the surface light source unit according to the third embodiment of the present invention.

[FIG. 25] FIG. 25 illustrates a direct type backlight of a conventional technique. FIG. 25A is a perspective view of a backlight portion in which an inner portion can be seen through.

FIG. 26 shows a surface lighting light source device of another conventional technique, FIG. 26A being a schematic perspective view and FIG. 26B being a cross-sectional view taken along the line XXVIB-XXVIB in FIG. 26A.

BEST MODE(S) FOR CARRYING OUT THE INVENTION

Description of the embodiments will be given below with reference to the drawings. It should be noted that the embodiments described below exemplify a surface light source unit, as well as a surface illumination device and a liquid crystal display device that use the surface light source unit for embodying the technical idea of the present invention and thus are not intended to limit the present invention to the embodiments. The present invention can be equally applied to other embodiments included in a scope of claims.

[First Embodiment]

Figure 1A:
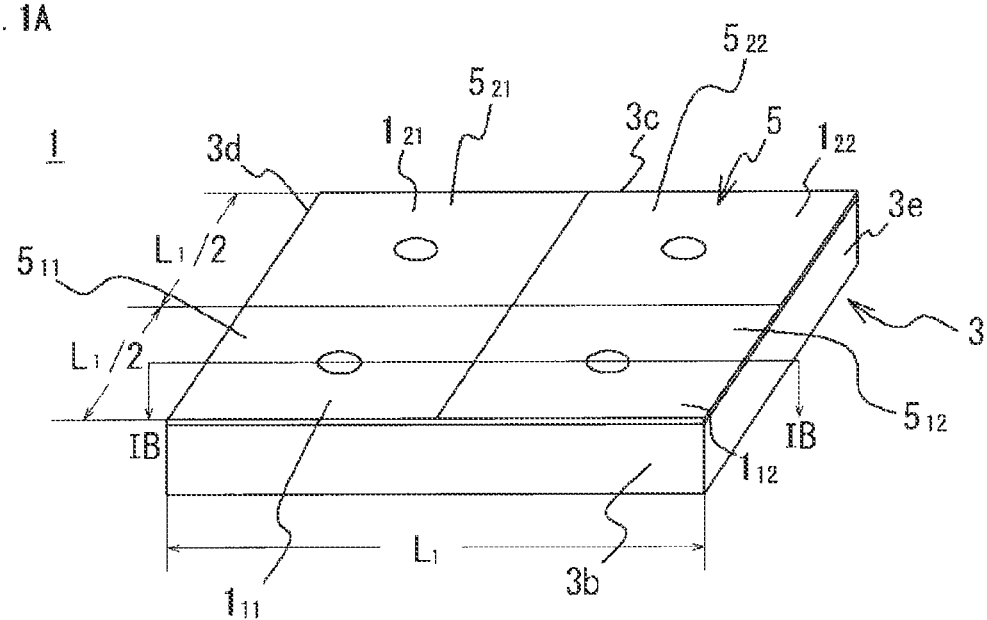
[FIG. 1]
Figure 1B:
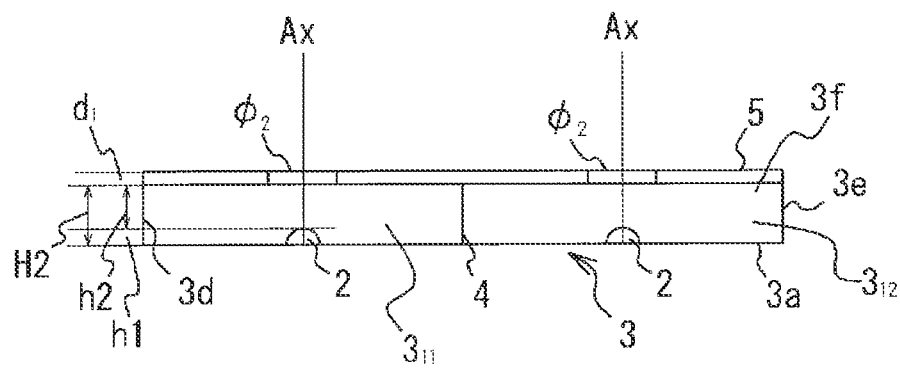
Figure 2:
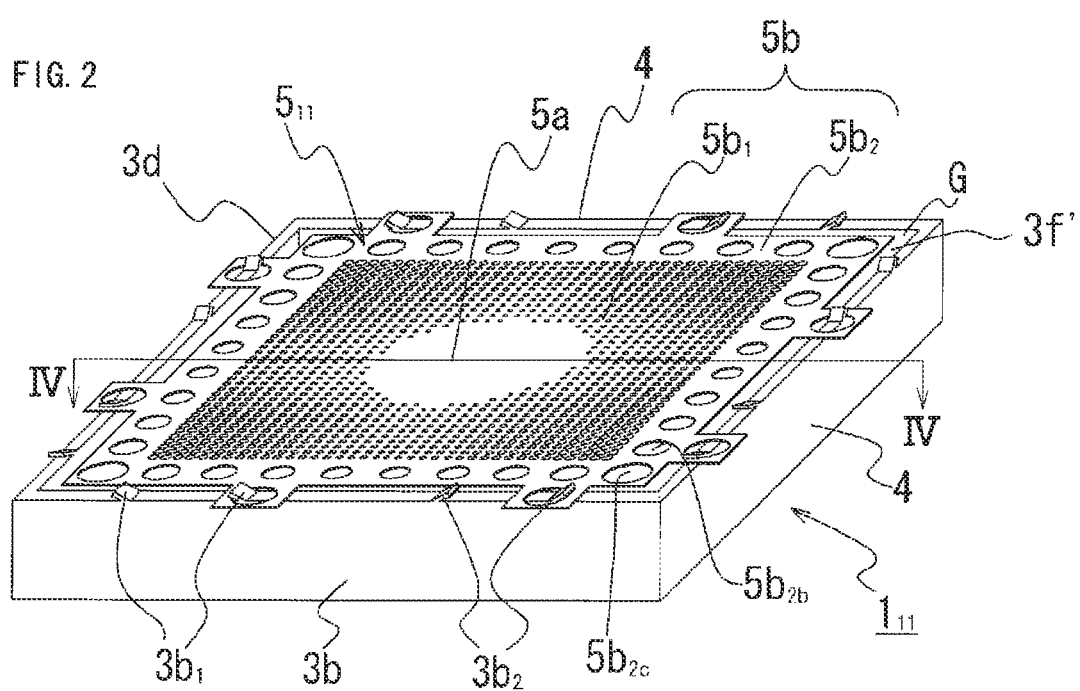
[FIG. 2]
Figure 3:
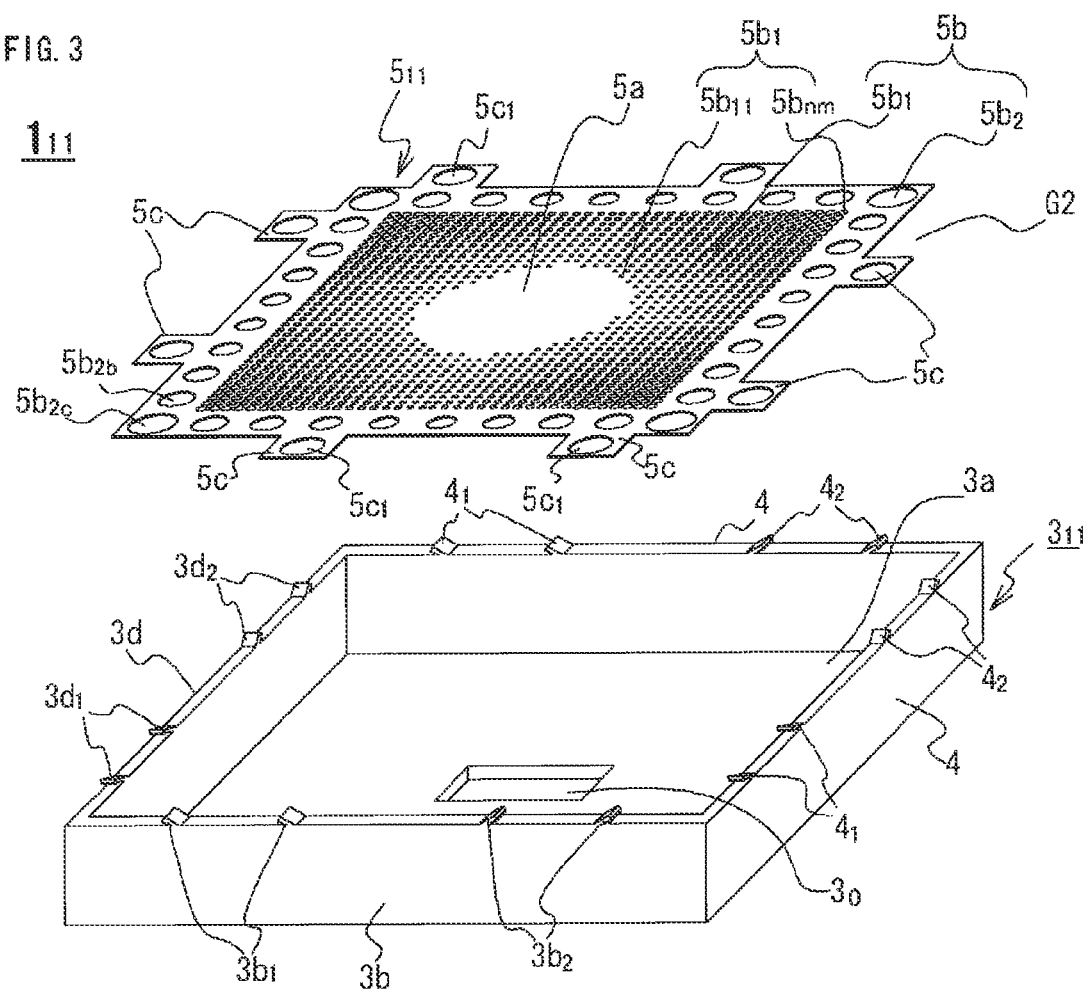
[FIG. 3]

A surface light source unit according to a first embodiment of the present invention will be described with reference to FIG. 1 to FIG. 5. FIG. 1 illustrates the surface light source unit according to the first embodiment of the present invention. FIG. 1A is a schematic diagram of the surface light source unit. FIG. 1B is a cross-sectional view taken along the line IB-IB in FIG. 1A. FIG. 2 is a perspective view of one of the cell light sources in the surface light source unit in FIG. 1. FIG. 3 is an exploded perspective view of the cell light source in FIG. 2. FIG. 4 is a cross-sectional view of the cell light source taken along the line IV-IV in FIG. 2. FIG. 5A is a diagram illustrating an opening ratio curve of an opening provided in a light transmitting/reflecting plate in FIG. 2. FIG. 5B is an enlarged view of openings provided in the light transmitting/reflecting plate.

Figure 26A:
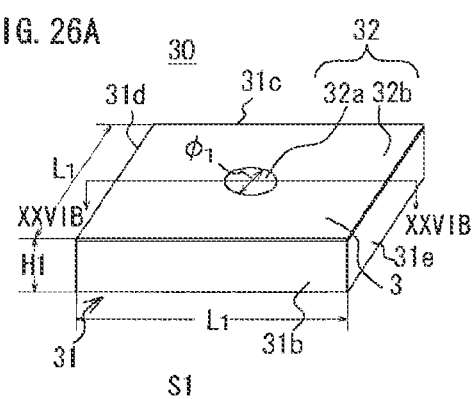
[FIG. 26]
Figure 26B:
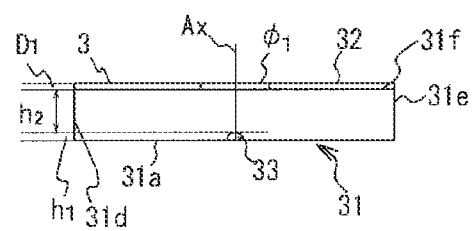

First of all, a surface light source unit 1 of the first embodiment of the present invention is described in comparison with a surface light source unit (see FIG. 26) of a conventional technique. As illustrated in FIG. 1, the surface light source unit 1 is generally formed by dividing the surface light source unit 30 of the conventional, technique into four cell light sources $1_{11}$ to $1_{22}$. The four cell light sources $1_{11}$ to $1_{22}$ have substantially the same structure. Each of the four cell light sources $1_{11}$ to $1_{22}$ is a miniaturized version of the surface light source unit 30 and thus is similar in shape to the surface light source unit. In the reference numeral of each of the cell light sources $1_{11}$ to $1_{22}$, first one of the subscript small letters indicates the row in FIG. 1A, while the second one of the small letters indicates the column. For example, the cell light source $1_{11}$ is a cell on a first row and a first column. The surface light source unit is referred to as a surface lighting light source device in the conventional technique.

The surface light source unit 1 includes four LEDs 2, a housing 3 in which the LEDs are disposed, and a light transmitting/reflecting plate 5 that covers an opening of the housing. The light transmitting/reflecting plate 5 is formed of a thin plate or film-shaped sheet that reflects the light from the LED, while allowing the light to pass through or transmit through a predetermined portion (region) thereof.

The LED 2 used herein emits white light. The LED may be an LED independently emitting white light, a group of a plurality of LED elements emitting different colors of light, or a plurality of LEDs. Besides the LED, a laser diode (LD) may also be used.

The housing 3 includes a square bottom plate $3a$ on which the LED 2 is disposed in the center portion and side plates $3b$ to $3e$ each standing to a predetermined height from the periphery of the bottom plate, and is provided with an opening 31 at an upper portion. Each of the side plates $3b$ to $3e$ stands vertically from the bottom plate $3a$ in this embodiment but may be inclined outward for a predetermined angle from the periphery of the bottom plate $3a$. Each of the side plates $3b$ to $3e$ is approximately half as tall as housing side plates $31b$ to $31e$ of the surface light source unit 30 of the conventional technique. Partition plates 4 partition an internal space of the housing 3 into four small chambers $3_{11}$ to $3_{22}$ (see FIG. 1B). The small chambers $3_{11}$ to $3_{22}$ have substantially the same size. Of the small chambers, two small chambers $3_{12}$ and $3_{22}$ are disposed on a rear side in FIG. 1A and thus the reference numerals thereof are not shown in FIG. 1B.

The housing 3 and the partition plates 4 are made of a material, e.g., an ultrafinely foamed light reflecting plate, having high light reflectance and low light transmittance. Each of the four small chambers $3_{11}$ to $3_{22}$ has the opening $3f$ on an upper portion and a mounting hole $3_0$ to receive the LED 2 is disposed at the center of the bottom plate $3a$ thereof (see FIG. 3). In each of the small chambers $3_{11}$ to $3_{22}$, pairs of latching claws by which the light transmitting/reflecting plate 5 is latched and fixed are formed on each of the top portions of the side plates $3b$ to $3e$ and partitions 4 with a predetermined distance provided between the pairs.

For example, as illustrated in FIG. 2 and FIG. 3, the side plate $3b$ is provided with pairs of latching claws $3b_1$ and $3b_2$, the pairs extending in directions opposite to each other. With the pairs of latching claws extending in directions opposite to each other, the light transmitting/reflecting plate is engaged while being expanded when engaging latching holes of the light transmitting/reflecting 5 with the latching claws, and thus can be surely engaged. Particularly, generation of wrinkles can be prevented when a thin film-shaped light transmitting/reflecting plate is used.

The partition plate 4 is also provided with latching claws $4_1$ and $4_2$. Other side plates and other partition plates are each provided with the latching claws. The means for latching and fixing the light transmitting/reflecting plate 5 to the side plates and the partition wall may be other means such as an adhesive for example. Preferably, the partition plate 4 is provided with a notch or a through hole through which light transmits at a portion of the top portion between the pairs of latching claws $4_1$ and $4_2$. When the partition plate 4 is provided with such a notch or through hole, a partition wall portion between the adjacent cell light sources do not become dark, and illumination, light having intensity substantially the same as that at other portions can be obtained thereat. When a plurality of surface light source units 1 are adjacently arranged to form a large surface illumination device, a similar notch or through hole is preferably provided on each of the housing side plates $3b$ to $3e$ of the adjacent surface light source units 1. With these notches, similar operational effects can be obtained in the large surface illumination device.

The light transmitting/reflecting plate 5 includes four mini-light transmitting/reflecting plates $5_{11}$ to $5_{22}$ that each cover the opening $3f$ of the corresponding one of the small chambers $3_{11}$ to $3_{22}$, and is formed of a thin (e.g., 0.5 mm to 1.0 mm) material having high light reflectance and low light transmittance such as an ultrafinely foamed light reflective material. Other film sheet materials may also be used. The mini-light transmitting/reflecting plates $5_{11}$ to $5_{22}$ have substantially the same structure, and a surface facing the bottom plate $3a$ of the housing 3 is a reflective surface and an outer surface is an emission surface.

The configuration is exemplified in which the light transmitting/reflecting plate 5 includes the mini-light transmitting/reflecting plates $5_{11}$ to $5_{22}$. Alternatively, the mini-light transmitting/reflecting plates $5_{11}$ to $5_{22}$ may be combined into a single reflecting plate, or some sets of the mini-light transmitting/reflecting plates $5_{11}$ to $5_{22}$ may be combined to form a plurality of reflecting plates. For example, the mini-light transmitting/reflecting plates $5_{11}$ and $5_{12}$ may be combined. The size of the light transmitting/reflecting plate and how the mini-light transmitting/reflecting plates are combined are determined on the basis of the housing and the number of small chambers.

A configuration of a single mini-light transmitting/reflecting plate $5_{11}$ will be described with reference to FIG. 2 to FIG. 5. As illustrated in FIG. 3 and FIG. 4, the mini-light transmitting/reflecting plate $5_{11}$ is divided into a mini-central reflecting section $5a$ at the center and a mini-outer reflecting section $5b$ on the outer periphery of the mini-central reflecting section. The mini-central reflecting section $5a$ is a circular region that has a predetermined radius (diameter $\phi_2$) from a point at which the mini-central reflecting section $5a$ intersects with a light axis Ax of the LED 2, is provided at a portion directly above the LED 2, and receives the illumination light having the highest intensity from the LED. The light axis Ax is an axis having a directional angle of 0 degree in the light distribution characteristics of the LED.

The mini-central reflecting section $5a$, which receives the light having the highest intensity from the LED 2, is adjusted to have predetermined reflectance and transmittance that can prevent this portion from being dark and prevent the generation of a bright spot. The mini-outer reflecting section $5b$ is provided with openings of predetermined sizes that make a portion farther from the mini-central reflecting section $5a$ allow a larger amount of light to transmit therethrough. The mini-central reflecting section $5a$ and the mini-outer reflecting section $5b$ will be described below.

The mini-central reflecting section 5a receives the strongest illumination light from the LED 2, and thus is formed by processing a mini-light transmitting/reflecting plate material to have high light reflectance and low light transmittance. The mini-light transmitting/reflecting plate material is processed by: forming a plurality of minute holes on the mini-light transmitting/reflecting plate material; and adjusting the thickness of the mini-light transmitting/reflecting plate material or forming non-through holes (groove holes), for example, with a predetermined pattern, while the mini-light transmitting/reflecting plate material remains unprocessed. Thus, the mini-light transmitting/reflecting plate material is provided with high light reflectance and low light transmittance. The high transmittance means a transmittance of about 98% to 99.3%, for example. By thus setting the high reflectance and the low transmittance to predetermined values, no glare is generated in the mini-central reflecting section 5a irradiated with high intensity light and the mini-central reflecting section 5a does not become dark. Thus, substantially uniform light is emitted.

A diameter $\phi_2$, more specifically, an area of the mini-central reflecting section 5a is determined to be in a predetermined ratio with respect to the entre area of the mini-light transmitting/reflecting plate $5_{11}$ so that the cell light source $1_{11}$ can have a predetermined height (half of that in the conventional technique). In the cell light source $1_{11}$, when the LED 2 is disposed in the small chamber $3_{11}$ and the mini-light transmitting/reflecting plate $5_{11}$ is mounted to the opening $3f$, the mini-central reflecting section 5a directly above the LED 2 is irradiated with the light having the highest intensity. The intensity of light is inversely proportional to the square of the distance along the light axis Ax. Thus, the intensity of the light is low when the distance between the LED 2 and the mini-light transmitting/reflecting plate $5_{11}$ is long and is high when the distance is short.

Accordingly, in the first embodiment, the distance between the LED 2 and the mini-light transmitting/reflecting plate $5_{11}$ is short, and thus, although the entire area of the mini-light transmitting/reflecting plate $5_{11}$ is reduced, the radius $\phi_2$ of the mini-central reflecting section 5a is set to 10 mm, which is the same as the diameter $\phi_1$ of the central reflecting section 32a of the surface light source unit 30 of the conventional technique. As a result, it has been confirmed that uniform light is emitted from the mini-central reflecting section 5a irradiated with high intensity light, without generating a light spot thereat and making the portion dark. An area ratio $\Delta S2/S2$ is 3.14% where S2 is the entire area of the mini-light transmitting/reflecting plate $5_{11}$ and $\Delta S2$ is an area of the mini-central reflecting section. Thus, an increase from the area ratio 0.78% in the conventional technique is confirmed. By thus setting a predetermined area ratio, the cell light source $1_{11}$ can have a smaller height while the uniform illumination light can be obtained.

By thus setting a predetermined ratio of the mini-central reflecting section area $\Delta S2$ to the entire area S2, i.e., 3.14% in the first embodiment, so that the cell light source $1_{11}$ can be short in height, the surface light source unit 1 as a whole can have a shorter height, that is, a reduced thickness. The shape of the mini-central reflecting section 5a, which is circular in the first embodiment, may be any other shape such as an elliptical shape or a rectangular shape.

As illustrated in FIG. 2 and FIG. 3, the mini-outer reflecting section 5b includes: an outer peripheral reflecting section $5b_1$ provided with a plurality of openings having sizes that differ along with the distance from the periphery of the mini-outer reflecting section 5a toward the outer side; a peripheral reflecting section $5b_2$ that is on the outer periphery of the outer peripheral reflecting section $5b_1$ and has a plurality of openings having a predetermined size; and pairs of mounting pieces 5c provided on the periphery of the peripheral reflecting section $5b_2$ with a predetermined distance provided there between. The mini-outer reflecting section 5b has a size that allows a gap G to be provided between each of the mounting pieces 5c and the small chamber opening $3f$ when the mini-outer reflecting section 5b is mounted to the housing 3.

When the mini-outer reflecting section 5b is mounted to the housing 3, the light emitted from the LED 2 is reflected between the mini-outer reflecting section 5b and the inner wall surfaces of the housing 3 once or for multiple times before propagating towards the external. The reflected light is more attenuated at a portion farther from the mini-central reflecting section 5a. Thus, the size of the opening of the outer peripheral portion $5b_1$ and the peripheral reflecting section $5b_2$ is set to be larger at a portion farther from the mini-central reflecting section 5a.

A plurality of openings $5b_{11}$ to $5b_{nm}$ of the outer peripheral reflecting section $5b_1$, i.e., an opening ratio A from the mini-central reflecting section 5a toward the outer side, is determined by the following Formula (1). The opening ratio A represents the area of an opening at a predetermined region with respect to a predetermined region area (reference area) in the mini-light transmitting/reflecting plate $5_{11}$ (opening area of predetermined region/reference area).

$$A=bx^2+c \qquad \text{Formula (1)}$$

In the formula, A is an opening ratio, x is a distance from the center of the reflecting plate, and b and c are constants.

The opening ratio A forms a quadric curve as shown in FIG. 5A in which a horizontal axis represents the distance x and a vertical axis represents the opening ratio A. Specifically, the opening ratio A proportionally increases along with the square of the distance from the center of the mini-light transmitting/reflecting plate $5_{11}$ facing the LED 2. The uniform illumination light can be obtained by thus making the opening ratio small at a portion near the center of the mini-light transmitting/reflecting plate at which the intensity of light is high, and large at a peripheral portion far from the LED 2 at which the light intensity is smaller.

Specifically, as illustrated in FIG. 5B, an opening $5b_{pq}$ ($1 \le p \le n$, $1 \le q \le m$) is formed as a circular hole having a diameter $R_{pq}$ the opening ratio A with respect to the reference area $S_{unit}$. In the first embodiment, the opening ratio A increases along with the distance from the center of the reflecting plate facing the LED. Thus, uniform illumination light can be obtained at a surface apart from the surface of the mini-light transmitting/reflecting plate in a light radiation direction for a predetermined distance (e.g., 5.0 mm) or more.

As illustrated in FIG. 3, the peripheral reflecting section $5b_2$ includes openings $5b_{2c}$ provided on the four corners of the mini-light transmitting/reflecting plate $5_{11}$ and openings $5b_{2b}$ provided between the openings $5b_{2c}$. The openings $5b_{2b}$ include multiple openings, have substantially the same diameter that is larger than the diameter of the opening in the mini-outer reflecting section $5b_1$. Portions near the openings $5b_{2c}$ provided on the four corners are the farthest from the LED 2. Thus, the diameter of the opening $5b_{2c}$ is set to be larger than that of the openings $5b_{2b}$. The opening in the peripheral reflecting section $5b_2$, which is a circular hole herein, may be an opening of any other shape such as a rectangular hole for example. A mounting hole $5c_1$ that engages with the latching claw of the housing 3 is formed on each of the pair of mounting piece 5c.

The surface light source unit 1 is assembled with the housing 3 and the light, transmitting/reflecting plate 5 having the above described configuration. The surface light source unit 1 is assembled by: disposing the LED 2 substantially at the center of the bottom plate 3a of each of the small chambers 3₁₁ to 3₂₂ of the housing 3; covering the opening 3f of each of the small chambers 3₁₁ to 3₂₂ with the corresponding mini-light transmitting/reflecting plates 5₁₁ to 5₂₂ each including the mini-central reflecting section 5a and the mini-outer reflecting section 5b; and fixing each of the mini-light transmitting/reflecting plate in the opening 3f and the top portions of the side plates 3b to 3e of the housing 3.

In the first embodiment, an example where the light transmitting/reflecting plate 5 includes the mind-light transmitting/reflecting plates 5₁₁ to 5₂₂ is described. Alternatively, the light transmitting/reflecting plate 5 as a whole may be formed of one of the mini-light transmitting/reflecting plates 5₁₁ to 5₂₂ or a set of two of the mini-light transmitting/reflecting plates 5₁₁ to 5₂₂. As illustrated in FIG. 1B and FIG. 4, in the assembled surface light source unit 1, a protrusion height of the LED 2 from the bottom plate 3a is h1, while a height from the top of the LED 2 to the central reflecting section 5a is h2. The height h2 is a length along the light axis Ax, and is a distance from the LED 2 to a center portion of the mini-central reflecting section 5a.

The dimensions in the surface light source unit 1 are described in comparison with the surface light source unit 30 of the conventional technique as follows with the length of one side of the bottom plate 3a of the housing represented by L₁, the height of the side plates 3b to 3e of the housing represented by H2 (½H1), the length of one side of the light transmitting/reflecting plate 5 represented by L₁, the thickness of the light transmitting/reflecting plate 5 represented by D₁, the diameter of the central reflecting section represented by φ₂, the height of the LED 2 represented by h1, and the height from the LED 2 to the central reflecting section of the light transmitting/reflecting plate represented by h2. Specifically, the height H2 of the housing 3 is 7.5 mm. L1 and the thickness D₁ of the light transmitting/reflecting plate is 100 mm and 1.0 mm, respectively. The diameter φ₂, h₁, and h₂ are 10 mm, 1 mm, and 6.5 mm, respectively. H2 is the sum of h₁ and h₂.

When the area ΔS2 of the central reflecting section in the area S2 of each of the mini-light transmitting/reflecting plates 5₁₁ to 5₂₂ of the light transmitting/reflecting plate 5 is calculated on the basis of the dimensions, S2 is ½L₁×½L₁, i.e., 50 mm×50 mm and ΔS2 is π×(½×φ₂)², i.e., (π×5² (mm²)). The area ratio ΔS2/S2 of the area ΔS2 of the central reflecting section to the area S2 of the mini-light transmitting/reflecting plate 5 is 3.14%. The area ratio 3.14% is larger than the area ratio 0.78% in the conventional technique.

In the surface light source unit 1 of the first embodiment, the surface light source unit 1 is divided into the four cell light sources 1₁₁ to 1₂₂. Thus, the volume of each of the cell light sources 1₁₁ to 1₂₂ is smaller. Accordingly, in the small chamber of each of the cell light sources, the light from the LED 2 is reflected for smaller times compared with that in the light source unit of the conventional technique in which the volume is large, and thus the loss of light is reduced. Furthermore, the surface light source unit 1 has the ratio ΔS2/S2 of the area of the mini-central reflecting section to the area S2 of each of the mini-light transmitting/reflecting plates 5₁₁ to 5₂₂ of the respective cell light sources 1₁₁ to 1₂₂ set to a predetermined value, i.e., 3.14%. Thus, the thickness of the light source unit 1 in the radiation direction of the LED 2 can be halved from that in the light source unit of the conventional technique. Accordingly, the light source unit 1 can have reduced thickness, and furthermore, uniform illumination light can be obtained and a high illumination quality can be secured.

In the surface light source unit 1 of the first embodiment, an internal space of the housing is partitioned into a plurality of small chambers having the same size by using the partition plate. Alternatively, the small chambers may have different sizes. The small chambers having the different sizes have the openings 31 having different sizes. The area ratio ΔS2/S2 in each mini-light transmitting/reflecting plate covering the opening of the small chamber is determined on the basis of the size of the openings. For example, the area ratio is set to be small when the opening 3f is large and is set to be large when the opening 3f is small.

[Second Embodiment]

Figure 6A:
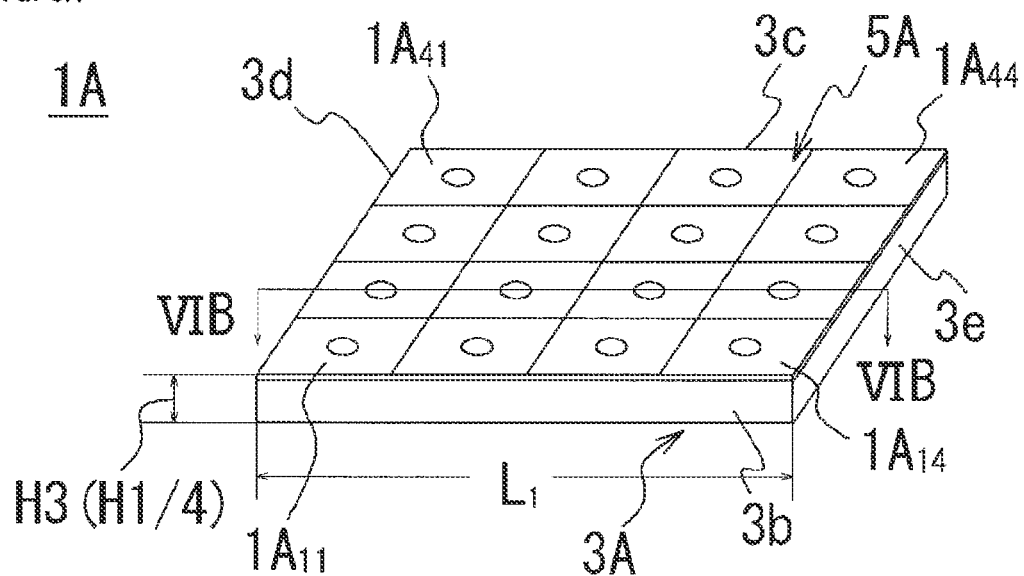
[FIG. 6]
Figure 6B:
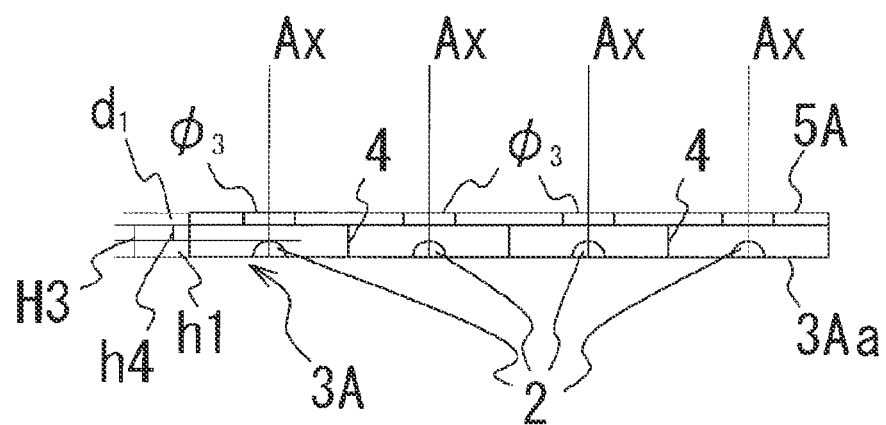
Figure 7:
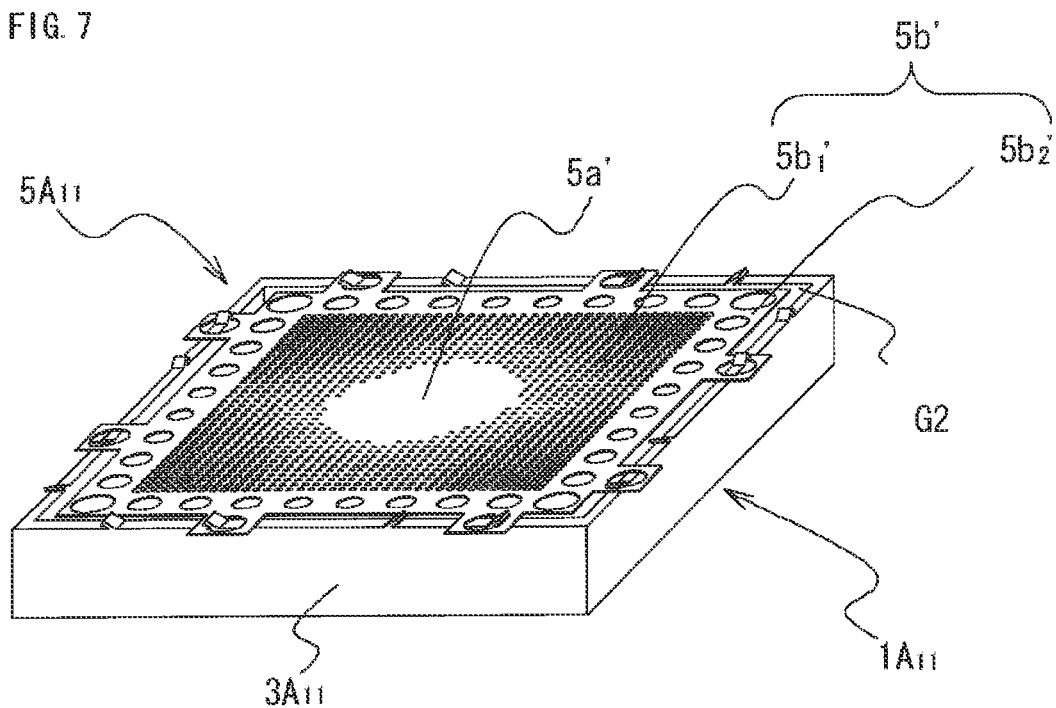
[FIG. 7]

A surface light source unit 1A according to a second embodiment of the present invention will be described with reference to FIG. 6 and FIG. 7. FIG. 6 illustrates the surface light source unit according to the second embodiment of the present invention. FIG. 6A is a schematic diagram of the surface light source unit. FIG. 6B is a cross-sectional view taken along the line VIB-VIB in FIG. 6A. FIG. 7 is a perspective view of one of the cell, light sources in the surface light source unit in FIG. 6.

A surface light source unit 1A according to the second embodiment of the present invention is formed by dividing the surface light source unit 30 (see FIG. 26) of the conventional technique into 16 small cell light sources 1A₁₁ to 1A₄₄. The small cell light sources 1A₁₁ to 1A₄₄ have substantially the same configuration and are similar in shape to the surface light source unit 30 of the conventional technique. In the description given below, the portions same as those of the conventional surface light source unit 30 are denoted with the same reference numerals, and the overlapping description will be omitted. Different portions will be described in detail.

The surface light source unit 1A includes 16 LEDs 2, a housing 3A in which the LEDs are disposed, and a light transmitting/reflecting plate 5A that covers the opening of the housing. The housing 3A has side plates 3b to 3e having a height that is one fourth of the height H1 of the housing side plates 32b to 32e of the surface light source unit 30 of the conventional technique, and has an inner space partitioned into 16 small chambers 3A₁₁ to 3A₄₄ by the partition plates 4 forming a lattice shape. The small chambers 3A₁₁ to 3A₄₄ are each opened at the upper portion. The openings are 16 divisions of the large opening of the surface light, source unit 1A. The LED 2 is disposed at the center of the bottom plate 3Aa of each of the 16 small chambers 3A₁₁ to 3A₄₄.

The light transmitting/reflecting plate 5A includes 16 mini-light transmitting/reflecting plates 5A₁₁ to 5₄₄ each covering the opening of corresponding one of the small chambers 3A₁₁ to 3A₄₄ (note that reference numerals 5A₁₁ to 5A₄₄ are omitted in FIG. 6A) and is formed of a thin material having high light reflectance and low light transmittance, e.g., an ultrafinely foamed light reflective material. The mini-light transmitting/reflecting plates 5A₁₁ to 5A₄₄ have substantially the same structure, and a surface facing a bottom plate 3Aa of the housing 3A is a reflective surface and an outer surface is an emission surface. In this example, the configuration is exemplified in which the light transmitting/reflecting plate 5A includes the mini-light transmitting/reflecting plates 5A₁₁ to 5A₄₄. Alternatively, the mini-light transmitting/reflecting plates 5A₁₁ to 5A₄₄ may be combined into a single reflecting plate, or some sets of the mini-light transmitting/reflecting plates 5A₁₁ to 5A₄₄ may be combined to form a plurality of reflecting plates, e.g., two to four plates. The size of the light transmitting/reflecting plate and how the mini-light transmitting/reflecting plates are combined are determined, on the basis of the size of the housing or the number of small chambers.

As illustrated in FIG. 7, the mini-light transmitting/reflecting plates $5A_{11}$ are divided into a mini-central reflecting section $5a'$ at the center and a mini-outer reflecting section $5b'$ on the outer periphery of the mini-central reflecting section. The mini-central reflecting section $5a'$ is a circular region that has a predetermined radius (diameter $\phi_3$) from a point at which the mini-central reflecting section $5a'$ intersects with the light axis Ax of the LED 2, is provided directly above the LED 2, and receives the illumination light having the highest intensity from the LED.

The mini-central reflecting section $5a'$, which receives the light having the highest intensity from the LED 2, is adjusted to have predetermined reflectance and transmittance that can prevent this portion from being dark and prevent this portion from being a bright spot. The mini-outer reflecting section $5b'$ is provided with openings of predetermined sizes that make a portion farther from the mini-central reflecting section $5a'$ allow a larger amount of light to transmit therethrough.

The surface light source unit 1A is assembled by: disposing the LED 2 substantially at the center of the bottom plate 3Aa of each of the small chambers; covering the opening of each of the small chambers by the light transmitting/reflecting plate 5A including the mini-central reflecting section $5a'$ and the mini-outer reflecting section $5b'$; and fixing the light transmitting/reflecting plate 5A to the periphery of the opening of the housing 3A. In the surface light source unit 1A thus assembled, as illustrated in FIG. 6B, a protruding height of the LED 2 from the bottom plate 3Aa is h1, and a height from the top of the LED 2 to the central reflecting section $5a'$ is h4. The height h4 is a length along the light axis Ax, and is a distance from the LED 2 to a center portion of the center reflecting section $5a'$.

The dimensions in the surface light source unit 1A are described as follows with the length of one side of the bottom plate 3Aa of the housing represented by $L_1$, the height of the side plates 3b to 3e of the housing represented by H3 (¼×H1), the length of one side of the light transmitting/reflecting plate 5A represented by $L_1$, the thickness of the light transmitting/reflecting plate 5 represented by $d_1$, the diameter of the central reflecting section represented by $\phi_3$, the height of the LED represented by h1, and the height from the LED to the central reflecting section of the light transmitting/reflecting plate represented by h4. Specifically, the height H3 of the housing 3 is 3.75 mm. L1 and the thickness D of the light transmitting/reflecting plate is 100 mm and 1.0 mm, respectively. The diameter $\phi_3$, $h_1$, and $h_2$ are 10 mm, 1 mm, and 2.75 mm, respectively. H3 is the sum of h1 and h4.

When an area ΔS3 of the central reflecting section and an area S3 of one division of the light transmitting/reflecting plate 5A is calculated on the basis of the dimensions, S3 is ¼×$L_1$×¼×$L_1$, i.e., 25 mm×25 mm and ΔS3 is $\pi \times (½ \times \phi_3)^2$, i.e., ($\pi \times 5^2$ (mm²)). Accordingly, the area ratio ΔS3/S3 of the area ΔS3 of the central reflecting section to the area S3 of the light transmitting/reflecting plate 5A is 12.56%.

In the surface light source unit 1A of the second embodiment, the surface light source unit is divided into the 16 cell light sources. Thus, the volume of each of the cell light sources is smaller. Accordingly, in the small chamber of each of the cell light sources, the light from each of the LEDs 2 is reflected for smaller times compared with that in the light source unit i in which the volume is large, and thus the loss of light is reduced. Furthermore, the surface light source unit 1A has the ratio ΔS3/S3 of the area ΔS3 of the central reflecting section of each of the mini-light transmitting/reflecting plates to the area S3 of each cell light source set to a predetermined value, i.e., 12.56%. Thus, the thickness of the light source unit 1 in the radiation direction of the LED 2 can be reduced from that in the light source unit 1. Accordingly, the light source unit 1A can have more reduced thickness, and furthermore, uniform illumination light can be obtained and a high illumination quality can be secured.

In the surface light source unit 1A of the second embodiment, an internal space of the housing is partitioned into a plurality of small chambers having the same size by using the partition plates. Alternatively, the small chambers may have different sizes. The small chambers having the different sizes have the openings $3f$ having different sizes. The area ratio ΔS3/S3 in each mini-light transmitting/reflecting plate covering the opening is determined on the basis of the size of the openings. For example, the area ratio is set to be small when the opening $3f$ is large and is set to be large when the opening $3f$ is small.

Figure 9:
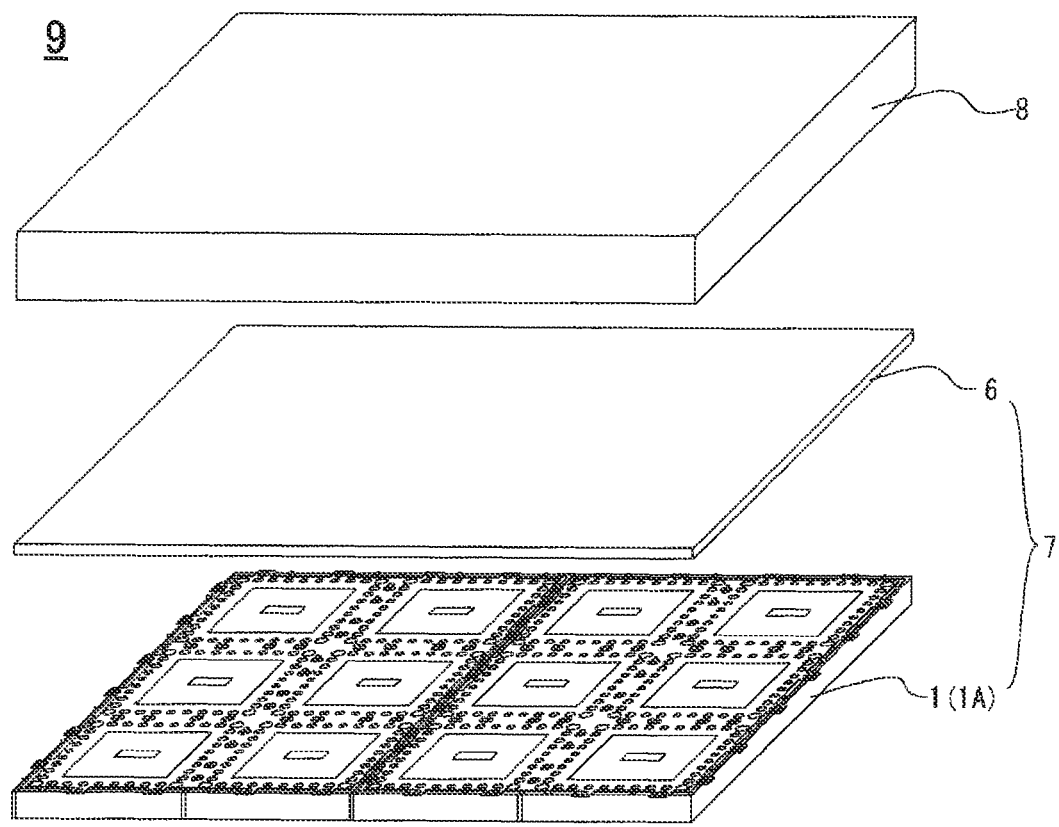
[FIG. 9]

The surface light source units 1 and 1A according to the embodiments are reduced in thickness with the areas ΔS1 and ΔS2 of the central reflecting section of the light transmitting/reflecting plate being the same. Alternatively, the areas may be changed in accordance with the height of the light source unit One or a plurality of the surface light source units of the embodiments can be used in a surface illumination device and a liquid crystal display device. With reference to FIG. 9, the surface illumination device and the liquid crystal display device that use one or a plurality of the surface light source units 1 and the surface light source units 1A will be described. FIG. 9 is an exploded perspective view of a surface illumination device and a liquid display device according to an embodiment of the present invention.

A surface illumination device 7 includes: the surface light source unit 1: and a diffusing plate 6 disposed on an upper surface of the light transmitting/reflecting plate of the surface light source unit 1. The diffusing plate 6 is preferably spaced apart from the light transmitting/reflecting plate with a slight gap therebetween, but may be in close contact with the light transmitting/reflecting plate. A liquid crystal display device 9 includes the surface illumination device 7 and a liquid crystal display panel 8 disposed on the upper surface of the diffusing plate 6.

Figure 8A:
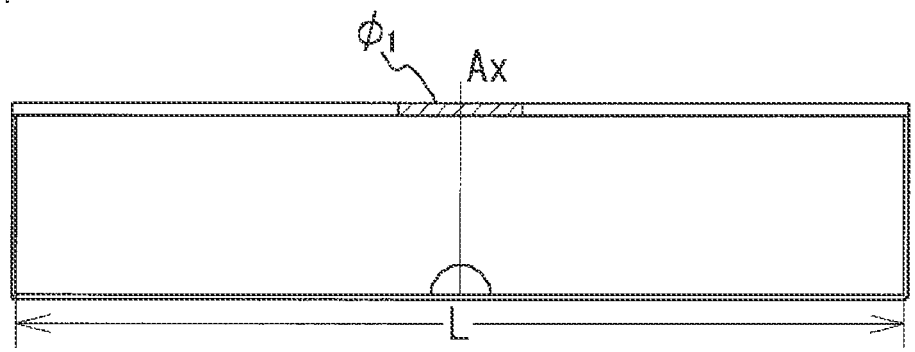
[FIG. 8]
Figure 8B:
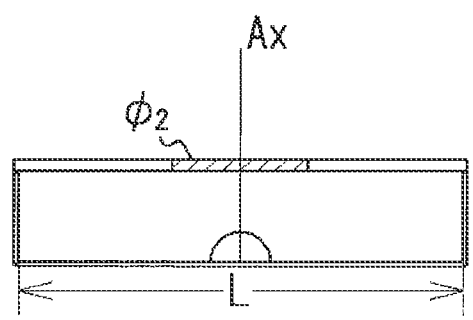
Figure 8C:
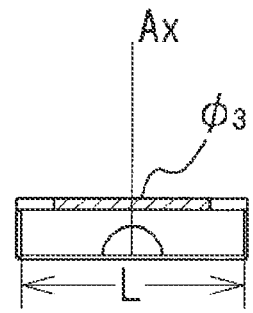

Relationships between the height of the side plates of a surface light source unit and an area of a central reflecting section will now be described with reference to FIG. 8. FIG. 8 illustrates the relationships between the height of the surface light source unit and the area of the central reflecting section. FIG. 8A is a cross-sectional view of the surface light source units 1, 1A, and 30 with a length L of one side being 100 mm. FIG. 8B is a cross-sectional view of the surface light source units 1, 1A, and 30 with the length L of one side being 50 mm. FIG. 8C is a cross-sectional view of the surface light source units 1, 1A, and 30 with the length L of one side being 25 mm.

As illustrated in FIG. 8, relationships between the heights of each of the side plates of the surface light source units 1, 1A, and 30 and the area (diameter) $\phi_1$, $\phi_2$, and $\phi_3$ of the central reflecting sections are set to satisfy $\phi_1 \leq \phi_2 \leq \phi_3$. The areas are set to be large when the height of the surface light source unit is small and set to be small when the height of the surface light source unit is large on the basis of the light distribution curve of the LED 2. This is because the size of the LED, which has no significant impact when a certain distance is provided between the LED and the light transmitting plate, cannot be ignored when the distance is short, and glare is generated in a larger area with a larger LED. With such a relationship, an operational effect same as those in the first embodiment and the second embodiment cart be provided.

[Third Embodiment]

Figure 10:
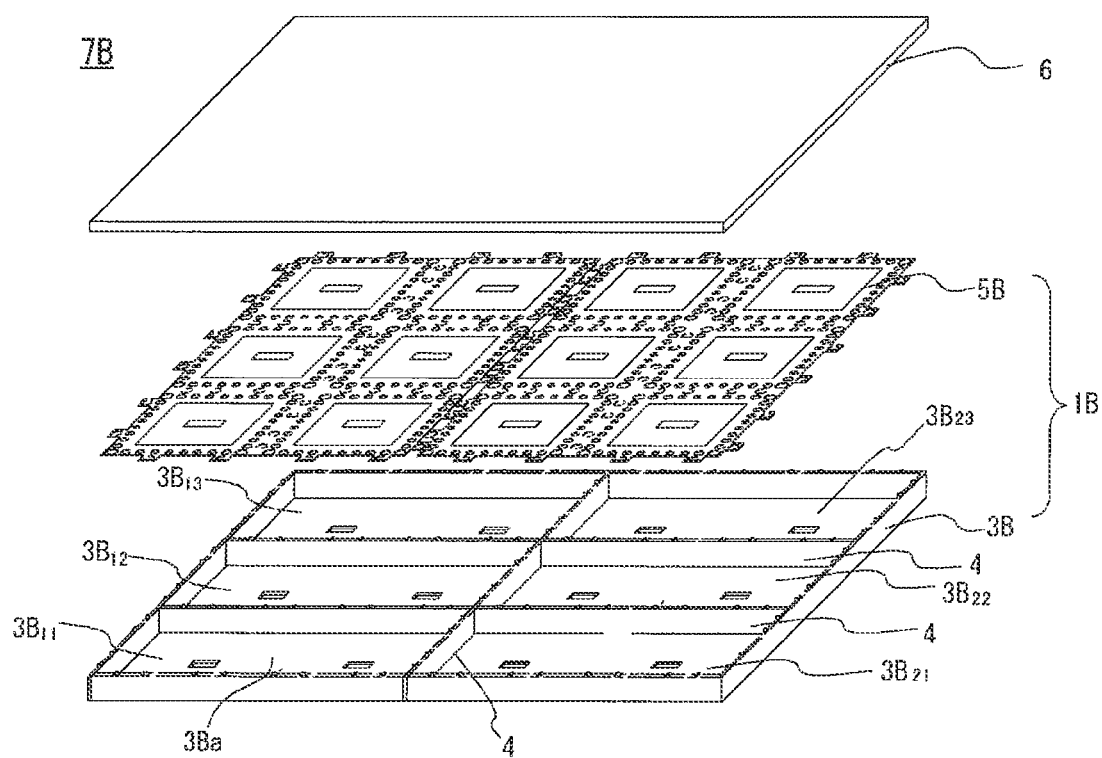
[FIG. 10]

A surface light source unit 1B according to a third embodiment of the present invention will be described with reference to FIG. 10. FIG. 10 is an exploded perspective view of the surface illumination device according to the third embodiment of the present invention. In the surface light source unit 1B according to a third embodiment of the present invention, some of the partition plates 4 in the surface light source unit 1A according to the second embodiment are omitted. In the description given below, the portions same as those of the surface light source unit 1A according to the second embodiment are denoted with the same reference numerals, and the overlapping description will be omitted. Different portions will be described in detail.

The surface light source unit 1B includes 12 LEDs 2, a housing 3B in which the LEDs are disposed, and a light transmitting/reflecting plate 5B that covers the opening of the housing. The housing 3B has an internal space partitioned into six small chambers $3B_{11}$ to $3B_{23}$ with the partition plates 4 forming a lattice form. The small chambers $3B_{11}$ to $3B_{23}$ are each opened at an upper portion. The openings are 6 divisions of the large opening of the surface light source unit 1B. Two LEDs 2 are disposed on a bottom plate 3Ba of each of the six small chambers $3B_{11}$ to $3B_{22}$.

The light transmitting/reflecting plate 5B includes two light transmitting/reflecting plates formed by combining six mini-light transmitting/reflecting plates that respectively cover the openings of the small chambers $3B_{11}$ to $3B_{23}$. The mini-light transmitting/reflecting plates each have two central reflecting sections respectively for the two LEDs in each of the small chambers $3B_{11}$ to $3B_{23}$.

The light transmitting/reflecting plate may be a single mini-light transmitting/reflecting plate or a plurality of plates formed by combining a plurality of mini-light transmitting/reflecting plates. The size of the light transmitting/reflecting plate and how the mini-light transmitting/reflecting plates are combined are determined in accordance with the size of the housing or the number of small chambers.

By thus omitting some of the partition plates 4 partitioning the internal space of the surface light source unit, the number of parts is reduced and assembling of the surface light source unit is facilitated. Accordingly, the cost for mass-producing surface light source units can be reduced.

[Fourth Embodiment]

Figure 11:
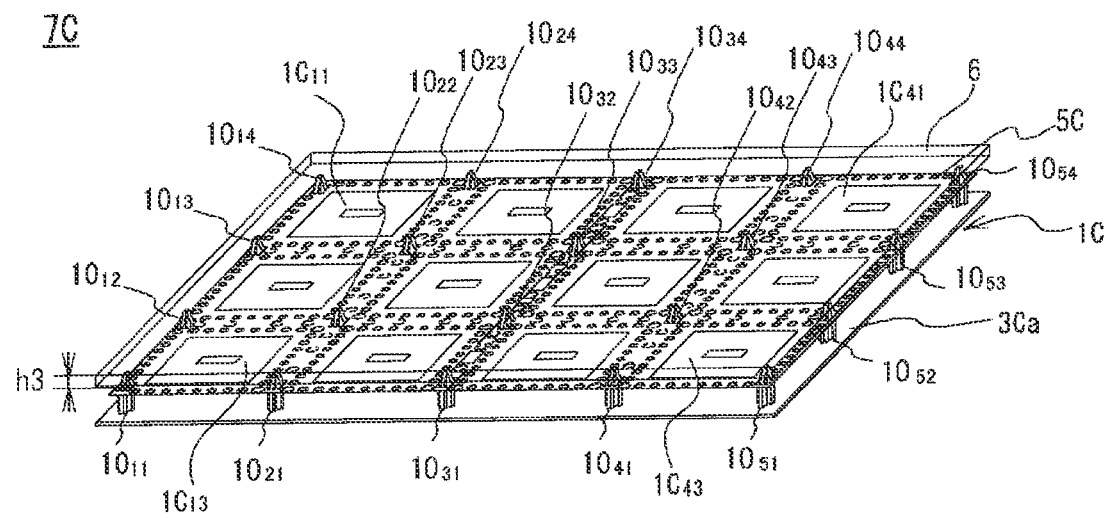
[FIG. 11]

A surface illumination device according to a fourth embodiment of the present invention will be described with reference to FIG. 11 to FIG. 13. FIG. 11 is a perspective view of the surface illumination device according to the fourth embodiment of the present invention. FIG. 12 is an exploded perspective view of the surface illumination device in FIG. 11. FIG. 13 illustrates a modification of a pillar in FIG. 11.

A surface light source unit used in the surface illumination device according to the fourth embodiment of the present invention has such a configuration that in the surface light source unit according to the third embodiment of the present invention, the partition plates 4 are omitted and pillars are provided instead to support the light reflecting/transmitting plate. In the description given below, portions same as those in the surface light source unit 1 are given the same reference numerals and the overlapping description is omitted. Different portions are described in detail.

A surface illumination device 7C according to the fourth embodiment of the present invention includes a surface light source unit 1C and the diffusing plate 6 disposed on the upper surface of a light transmitting/reflecting plate of the surface light source unit 1C.

The surface light source unit 1C includes 12 divided small cell light sources $1C_{11}$ to $1C_{43}$. In the surface light source unit 1C, a total of 12 LEDs 2 are respectively disposed at positions corresponding to the small cell light sources $1C_{11}$ to $1C_{43}$. The surface light source unit 1C includes a bottom plate 3Ca that forms a housing 3C and on which the LEDs are disposed and a light transmitting/reflecting plate 5C that covers a position facing the bottom plate 3Ca.

The bottom plate 3Ca is different from those in the surface light source units 1, 1A and 1B according to the first to the third embodiments in that the side walls are omitted and that the bottom plate 3Ca includes 12 small chambers $3C_{11}$ to $3C_{43}$ having the inner spaces connected to each other instead of being partitioned by the partition plates forming a lattice shape. The 12 small chambers $3C_{11}$ to $3C_{43}$ have the upper portions integrally opened. A total of 20 pillars $10_{11}$ to $10_{54}$ are provided at positions at which corners of the adjacent ones of the small chambers $3C_{11}$ to $3C_{43}$ are in contact with each other and at the four corners of the bottom plate 3Ca portions of each small chamber.

The light transmitting/reflecting plate 5C includes two mini-light transmitting/reflecting plates: a mini-light transmitting/reflecting plate $5C_1$ that covers the openings of the small chambers $3C_{11}$ to $3C_{23}$; and a mini-light transmitting/reflecting plate $5C_2$ that covers the openings of the small chambers $3C_{31}$ to $3C_{43}$. The mini-light transmitting/reflecting plates $5C_1$ and $5C_2$ each have six central reflecting sections. Thus, the mini-light transmitting/reflecting plates $5C_1$ and $5C_2$ have a total of 12 central reflecting sections for respective LEDs disposed in the small chambers $3C_{11}$ to $3C_{43}$. The light transmitting/reflecting plate 5C may be formed with individual mini-light transmitting/reflecting plates $5C_1$ and $5C_2$, or may be formed by integrally combining the mini light transmitting/reflecting plates $5C_1$ and $5C_2$. The size of the light transmitting/reflecting plate 5C and how the mini-light transmitting/reflecting plates are combined are determined on the basis of the size of the bottom plate 3Ca forming the housing or the number of small chambers.

At the positions of the mini-light transmitting/reflecting plates $5C_1$ and $5C_2$ corresponding to the small chambers $3C_{11}$ to $3C_{43}$, central reflecting sections each having the area $\Delta S1$ corresponding to the area S1 of the opening of the corresponding one of the small chambers $3C_{11}$ to $3C_{43}$ are formed. The relationship between S1 and $\Delta S1$ is determined in such a manner as to satisfy the relationship shown in FIG. 8. With such a configuration, the surface light source unit 1C also has the volume of each of the cell light sources smaller than that of the surface light source unit 30 of the conventional example. Thus, the light from each of the LEDs 2 is reflected for a smaller number of times, and thus the loss of light is reduced. Furthermore, the reduction in thickness can be achieved, and furthermore, uniform illumination light can be obtained and a high illumination quality can be secured.

In addition, in the surface light, source unit 1C, 20 pillars $10_{11}$ to $10_{54}$ each have a cross shape in the plan view and have tapered cross shape in which a distal end portion is tapered. The height of the pillars is larger than the distance between the LED 2 and the light transmitting/reflecting plate 5C. Thus, the distal end portion of each of the 20 pillars $10_{11}$ to $10_{54}$ protrudes from the surface of the light transmitting/reflecting plate 5C for a predetermined height h3. Accordingly, the diffusing plate 6 can be supported by the distal end portions of the 20 pillars $10_{11}$ to $10_{54}$.

Therefore, in the surface light source unit 13 of the fourth embodiment, the entire portion of the large light transmitting/reflecting plate formed by combining a plurality of mini-light transmitting/reflecting plates can be supported at an equal distance from the bottom plate 3a even though the partition plates are omitted. Furthermore, means for securing equal distance between the diffusing plate 6 and the light transmitting/reflecting plate 5C need not to be additionally provided. Thus, in conjunction with the omission of the partition plates that partition the internal space of the surface light source unit, the number of parts can be reduced to facilitate the assembling of the surface light source unit. Accordingly, the cost for mass-producing surface light source units can be reduced.

[Modification]

Figure 13A:
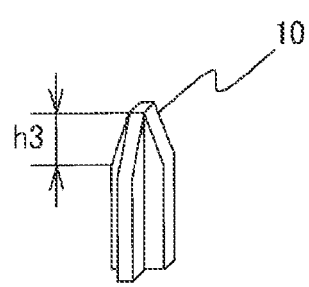
[FIG. 13]
Figure 13B:
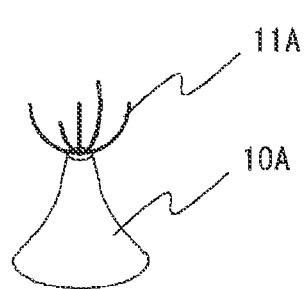

The number and the shape of pillars are not limited to those in the surface illumination device of this embodiment and the shape may be different therefrom. FIG. 13B illustrates a modification of the pillar provided in the surface illumination device of the fourth embodiment of the present invention. In this example, a pillar 10A has a conical shape. The LED has high directivity, and thus the intensity of light in the horizontal direction therefrom is lower than that of the light in the vertical direction. Thus, shadow is less likely to be produced by the pillar 10A at a portion near the bottom part of the housing. Accordingly, the pillar 10A has a width that is large at a portion near the bottom part and becomes dramatically small as it gets closer to the distal end.

The height of the pillar 10A is equal to the distance between the LED 2 and the light transmitting/reflecting, plate 5B. The light transmitting/reflecting plate can be supported by being placed on the distal ends of the pillars. A diffusing plate supporting member 11A formed by shaping a thin wire shaped supporting protrusion into a semispherical shape is provided at an upper portion of each of the pillar 10A. The diffusing plate can be supported at the end portion of the diffusing plate supporting member 11A.

Like the pillar of the fourth embodiment, the distal end portion of the pillar 10A may have a height larger than the distance between the LED 2 and the transmitting/reflecting plate 5B to support the diffusing plate 6 by the distal end portion thereof.

Figure 13C:
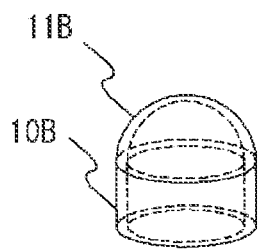

FIG. 13C illustrates another modification of the pillar. This pillar 10B has a hollow cylindrical shape and a diffusing plate supporting member 11B having a hollow semispherical shape is provided at a top portion of the pillar 10B having the hollow cylindrical shape. Unlike the pillars 10 and 10A, the hollow cylindrical pillar 10B and the hollow semi spherical diffusing plate supporting member 11B are each formed by a material having high light transmittance and low light reflectance. The hollow cylindrical pillar 10B is disposed no surround the periphery of each of the LEDs. The light transmitting/reflecting plate is supported by the hollow pillar 10B and the diffusing plate is supported by the top portion of the hollow semispherical diffusing plate supporting member 11B.

Figure 13D:
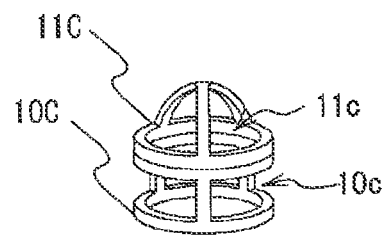

FIG. 13D includes a window hollow pillar 10C formed by providing a window 10c to the hollow cylindrical pillar 10B in FIG. 13C and a window hollow semi spherical diffusing plate supporting member 11C formed by providing window 11C to the hollow semispherical diffusing plate supporting member 11B in FIG. 13C. By thus providing the windows 10c and 11c, loss of light from the LED is reduced and a surface illumination device having lighter weight can be obtained compared with a case where the hollow cylindrical pillar 10B and the hollow semi spherical diffusing plate supporting member 11B are used.

[Fifth Embodiment]

Figure 14:
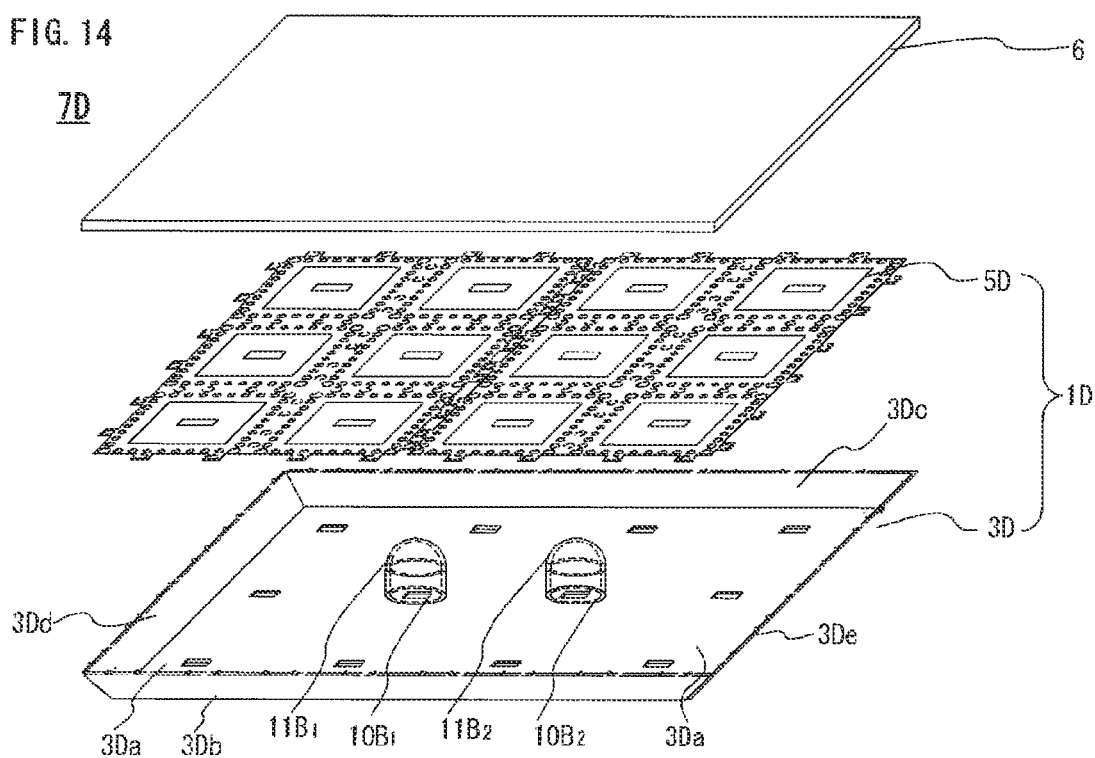
[FIG. 14]
Figure 15:
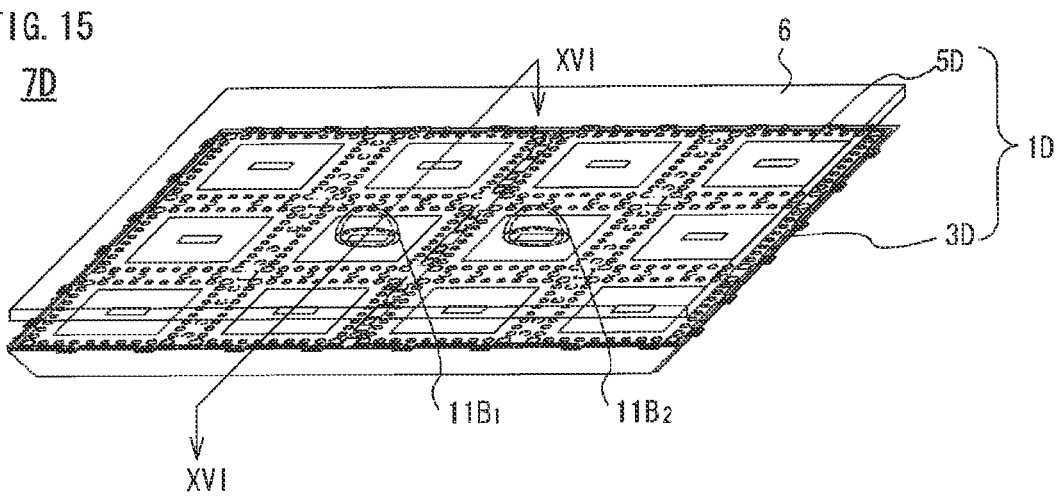
[FIG. 15]
Figure 16:
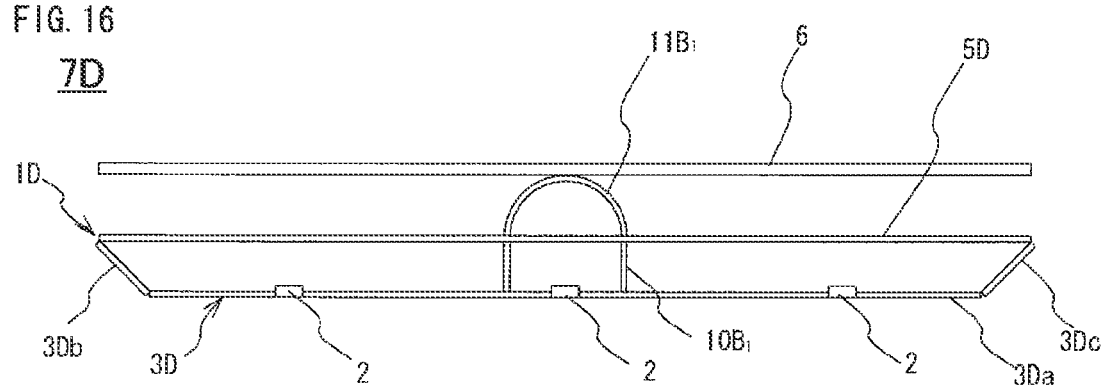
[FIG. 16]

A surface illumination device according to a fifth embodiment of the present invention employing the pillar 10B illustrated in FIG. 13C will be described with reference to FIG. 14 and FIG. 15. FIG. 14 is an exploded perspective view of the surface illumination device according to the fifth embodiment of the present invention. FIG. 15 is a perspective view of the surface illumination device in FIG. 14. FIG. 16 is a cross-sectional view taken along the line XVI-XVI in FIG. 14.

A surface light source unit used in the surface illumination device according to the fifth embodiment of the present invention is formed by partially changing the configuration of the surface light source unit according to the third embodiment of the present invention. In the description given below, portions same as those in the surface light source units 1A, 1B, and 1C are denoted with the same reference numerals and overlapping description will be omitted. Different portions will be described in detail.

A surface illumination device 7D according to the fifth embodiment of the present invention includes a surface light, source unit 1D and the diffusing plate 6 disposed on an upper surface of a light transmitting/reflecting plate of the surface light source unit 1D. The surface light, source unit 1D includes 12 divided small cell light sources. In the surface light source unit 1D, a total of 12 LEDs 2 are disposed at positions corresponding to the small cell light sources. The surface light source unit 1D includes a housing 3D in which the LEDs are disposed and a light transmitting/reflecting plate 5D that covers the opening of the housing.

The housing 3D includes a bottom plate 3Da and side plates 3Db to 3De. The side plates 3Db to 3De are each inclined outwardly for a predetermined angle from the periphery of the bottom plate 3Da. Preferably, the inclination angle with respect to the bottom plate 3Da is larger than 90° and is within about 150°. By thus making each of the side plates 3Db to 3De inclined outwardly for a predetermined angle from the periphery of the bottom plate 3Da, a housing opening and the diffusing plate 6 can be made larger than the bottom plate 3Da. Accordingly, a light emitting area can be increased.

In the housing 3D, 12 small chambers $3D_{11}$ to $3D_{43}$ of which the inner spaces are connected to each other are provided. The 12 small chambers $3D_{11}$ to $3D_{43}$ have the upper portions integrally opened. Pillars $10B_1$ and $10B_2$ are disposed to surround the periphery of the LEDs 2 in the small chambers $3D_{22}$ and $3D_{23}$ that are small chambers farthest from the housing side plates.

The two pillars $10B_1$ and $10B_2$ are each formed of a material having high light transmittance and low light reflectance and have hollow cylindrical shape. The height of the pillars $10B_1$ and $10B_2$ is equal to the distance between the LED 2 and the light transmitting/reflecting plate 5D. Thus, the light transmitting/reflecting plate 5D can be placed and fixed on the end portions of the pillars. The distal end portions of the pillars $10B_1$ and $10B_2$ are provided with semispherical diffusing plate supporting members $11B_1$ and $11B_2$, respectively, each being formed of a material having high light transmittance and low light reflectance like the material of the pillars $10B_1$ and $10B_2$. Thus, the diffusing plate 6 can be supported by the distal end portions of the diffusing plate supporting members $11B_1$ and $11B_2$.

With such a configuration, the emitted light is affected equally in any horizontal direction from the LEDs 2 disposed in the pillars. Accordingly, more uniform light can be obtained. Furthermore, the area of the light transmitting/reflecting plate supported by a single pillar can be increased. Thus, the number of pillars can be reduced.

As described above, in the surface light source unit 1D according to the fifth embodiment, the number of pillars can be reduced. Thus, in conjunction with the omission of the partition plates partitioning the internal space of the surface light source unit, the number of parts is reduced to facilitate the assembling of the surface light source unit. Accordingly, the cost for mass-producing surface light source units can be reduced.

In this embodiment, the pillars $10B_1$ and $10B_2$ as well as the diffusing plate supporting member 11B are each formed of a material having high light transmittance and low light reflectance. Alternatively, the pillar 10C and the diffusing plate supporting member 11C may be formed with a material that has high light reflectance and low transmittance like the material for the housing 3 and the light transmitting/reflecting plate 5. In such a case, a side wall of the cylindrical pillar should be partially cut out so that the light can transmit therethrough (see FIG. 13D). Similarly, in the diffusing plate supporting member 11C, a similar effect can be obtained by partially cutting out the semispherical member.

Figure 23A:
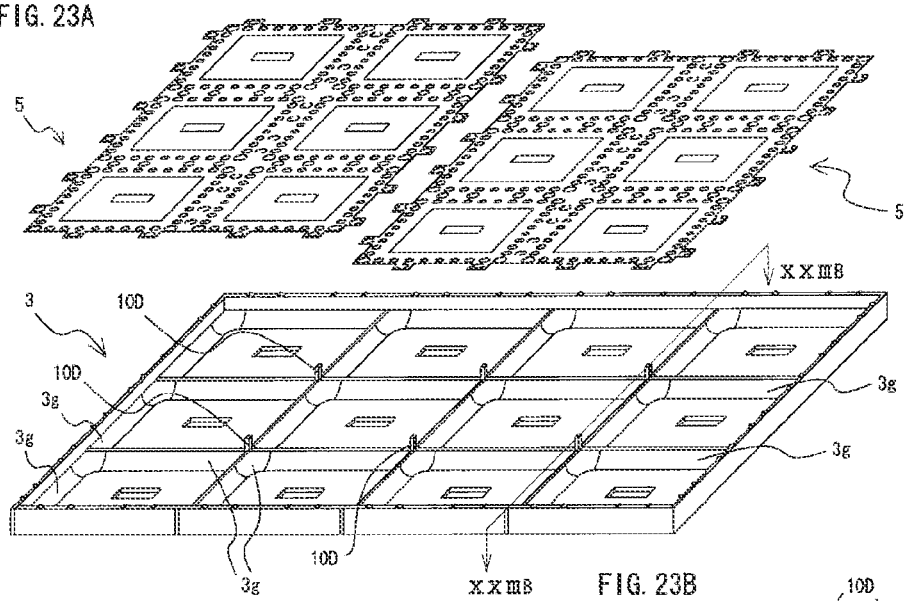
[FIG. 23]
Figure 23B:
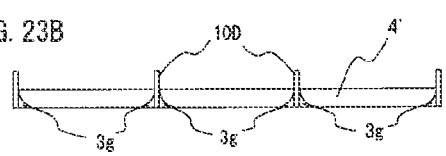
Figure 24:
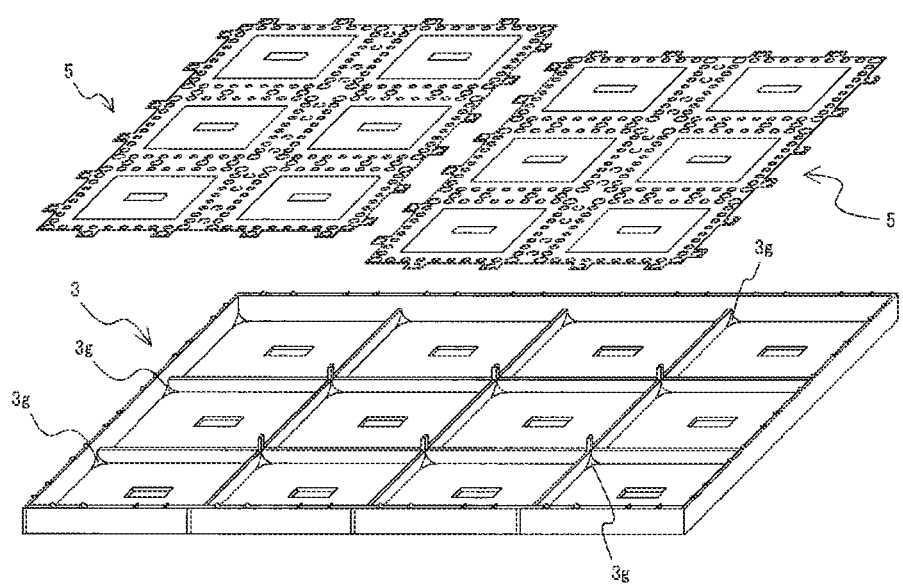
[FIG. 24]
Figure 25A:
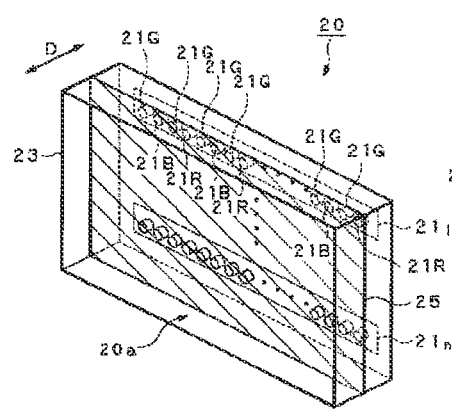
Figure 25B:
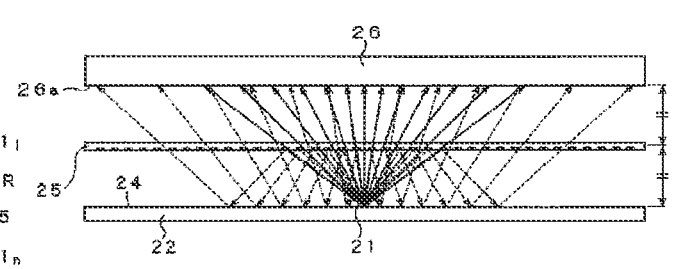
FIG. 25B is a partial cross-sectional view of FIG. 25A.

Furthermore, as in a modification shown in FIG. 23, partition plates 4' may be half as tall as the side wall in this modification, pillars 10D are each provided at an intersecting portion between partition plates 4' to prevent a light guiding/reflecting plate from being bent. Furthermore, a light reflecting member having a smooth curved shape may be mounted to prevent the intersection portion between the bottom plate and the partition plate 4' from forming a right angle. Any material having high light reflectance and low light transmittance like that of the housing 3 and the light transmitting/reflecting plate 5 may be used as the light reflecting member. The curved surface, which has the smooth curved shape in the modification as illustrated in FIG. 23B, may have a hyperboloidal shape or the like. The entire intersection portion between the bottom plate and the partition may not necessarily have a curved surface. Instead, only the portion around the pillar may have the curved surface as illustrated in FIG. 24.

[Sixth Embodiment]

Figure 17:
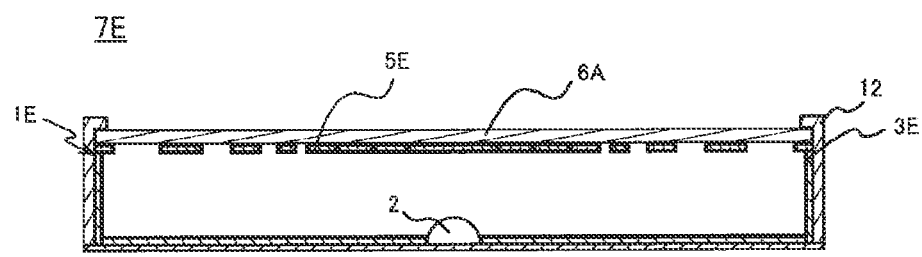
[FIG. 17]

A surface illumination device according to a sixth embodiment of the present invention will be described with reference to FIG. 17. FIG. 17 is a cross-sectional view of the surface illumination device according to the sixth embodiment of the present invention.

A surface light source unit used in the surface illumination device according to the sixth embodiment of the present invention is formed by partially changing the configuration of the surface light source unit according to the second embodiment of the present invention. In the description given below, portions same as those in the surface light source units 1 and 1A are denoted with the same reference numerals and overlapping description will be omitted. Different portions will be described in detail.

In a surface illumination device 7E according to the sixth embodiment of the present invention, a frame 12 that incorporates the surface light source unit 1E is provided outside a surface light source unit as illustrated in FIG. 17. It is preferable that a highly flame retardant metal material be used for the frame 12. Particularly, aluminum or similar highly flame retardant metal material which is light in weight and inexpensive is preferably used. A flame retardant diffusing plate 6A that transmits light is disposed above the light reflecting/transmitting plate. For example, glass, polycarbonate, or the like can be used for the diffusing plate 6A. A light transmitting/reflecting plate 5E and a housing 3E are each formed of an ultrafinely foamed light reflective material that has low heat resistance and thus may melt due to extreme heat produced by fire and the like. However, by covering such members with the metallic frame and the flame retardant diffusing plate, even when the heat produced by the fire and the like melts the ultrafinely foamed light reflective material inside, the molten material does not leak out as long as the diffusing plate 6A is not broken. Thus, flame resistance of the surface illumination device can be improved.

Unlike the surface light source unit of the first embodiment, the surface light source unit of this embodiment has no latching claws for fixing the light transmitting/reflecting plate 5E on the side walls of the housing 3E and on the partition plates 4E and no mounting holes are provided on the light transmitting/reflecting plate 5E. This is because, in this embodiment, assembling is performed in such a manner as to incorporate the housing 3E, the light transmitting/reflecting plate 5E, and the diffusing plate 6A in this order in the frame 12, and thus the light transmitting/reflecting plate 5E and the diffusing plate 6A can be mechanically supported.

[Seventh Embodiment]

Figure 18A:
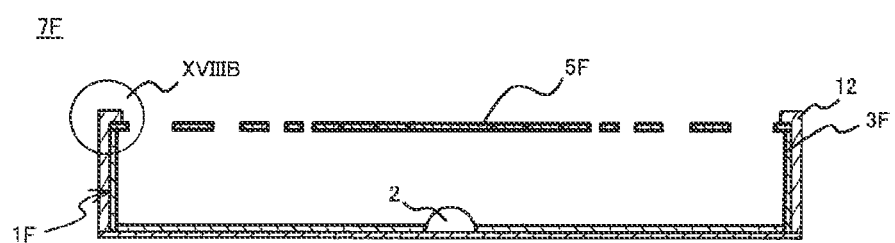
FIG. 18A is a cross-sectional view of a surface illumination device according to a seventh embodiment of the present invention.
Figure 18B:
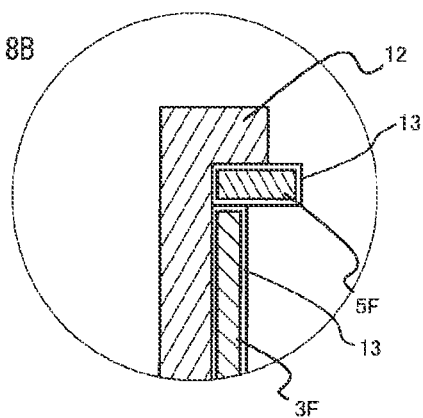
FIG. 18B is an enlarged view of a portion XVIIIB in FIG. 18A.
Figure 19:
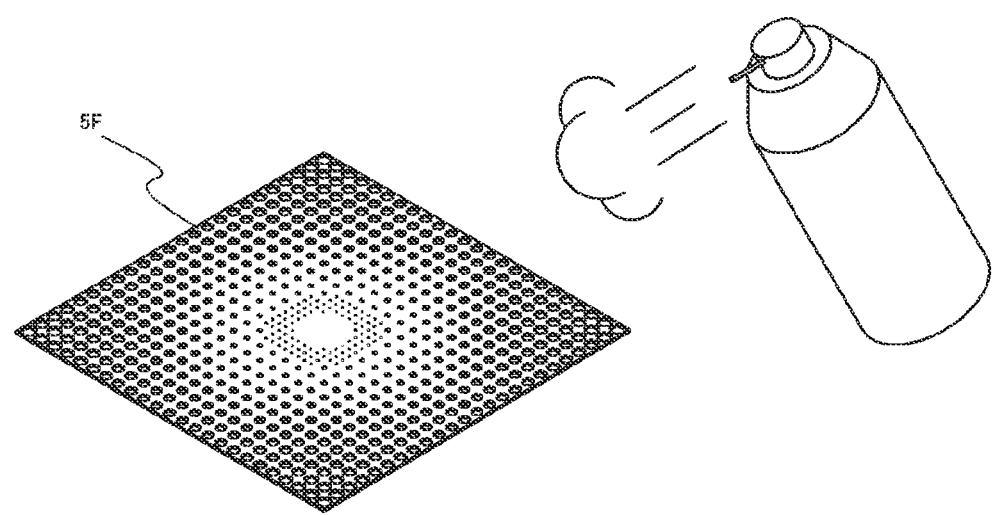
[FIG. 19]
Figure 20:
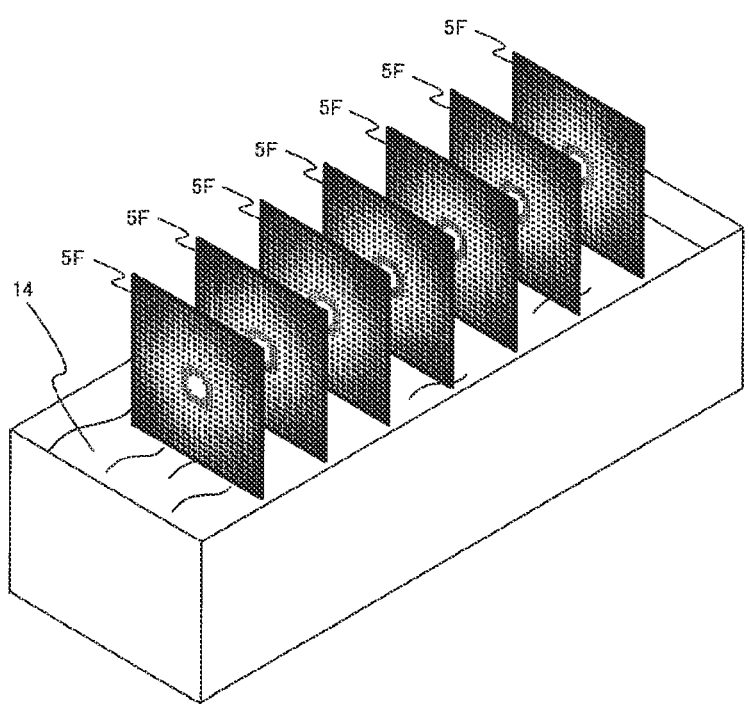
[FIG. 20]

A surface illumination device according to a seventh embodiment of the present invention will be described with reference to FIG. 18 to FIG. 20. FIG. 18A is a cross-sectional view of the surface illumination device according to the seventh embodiment of the present invention. FIG. 18B is an enlarged view of a portion XVIIIB in FIG. 18A. FIG. 19 is a schematic diagram illustrating an example of flame retardant processing for a light transmitting/reflecting plate in FIG. 18. FIG. 20 is a schematic diagram illustrating another example of the flame retardant processing for the light transmitting/reflecting plate in FIG. 18.

A surface light source unit used in the surface illumination device according to the seventh embodiment of the present invention is formed by partially changing the configuration of the surface light source unit according to the sixth embodiment of the present invention. In the description given below, portions same as those in the surface light source unit according to the sixth embodiment are denoted with the same reference numerals and overlapping description will be omitted. Different portions will be described in detail.

The surface illumination device according to the seventh embodiment of the present invention is similar to the sixth embodiment in that the frame 12 incorporating a surface light source unit 1F is provided outside the surface light source unit, but is different therefrom in that no diffusing plate is provided as illustrated in FIG. 18A, and flame retardant processing for a light transmitting/reflecting plate 5F, a housing 3F, and the partition wall is performed. In FIG. 18B, which is an enlarged view of a portion XVIIIB in FIG. 18A, a flame retardant layer 13 is formed on the periphery of the light transmitting/reflecting plate 5F and the housing 3F. The coating layer is similarly provided to the partition walls not illustrated. This processing is performed by applying a flame retardant such as a known boric-acid compound on both front and rear surfaces of the light transmitting/reflecting plate 5F by means of a spray as illustrated in FIG. 19 or by immersing a liquid flame retardant 14 in the light transmitting/reflecting plate 5F as illustrated in FIG. 20. Although not shown in the figures, the housing 3F and the partition walls are similarly processed. The flame retardant surface illumination device can be manufactured at a low cost by coating the light transmitting/reflecting plate 5F, the housing 3F, and the partition walls each being formed of an ultrafinely foamed light reflective material having low heat resistance to provide flame resistance thereto by using such a flame retardant.

Alternatively, the periphery of the light transmitting/reflecting plate 5F, the housing 3F, and the partition walls may be coated with a known flame retardant such as paraxylylene resin and polyethylene terephthalate by a method such as vacuum deposition. It is especially preferable that paraxylylene, which has little influence on light absorptivity, be used. The processing employing vacuum deposition can process a large number of light transmitting/reflecting plates 5F, housings 3F, and partition walls, and thus is suitable for mass-producing surface illumination devices. By thus improving the flame resistance of the light transmitting/reflecting plate 5F, the housing 3F, and the partition walls, the flame resistance of the surface illumination device of this embodiment can be also improved, and degradation of the light use efficiency due to the use of the diffusing plate can be prevented, and the manufacturing cost for the surface illumination device can be reduced. Instead of being coated with the flame retardant, the light transmitting/reflecting plate, the housing, and the partition walls may be formed of a polycarbonate resin having a relatively low light reflectance but having high flame resistance. Alternatively, a foaming agent such as polyethylene, polyolefin, and polypropylene, as well as ceramic, titan white, and pure silver coating having an antioxidant film may be used.

[Eighth Embodiment]

Figure 21A:
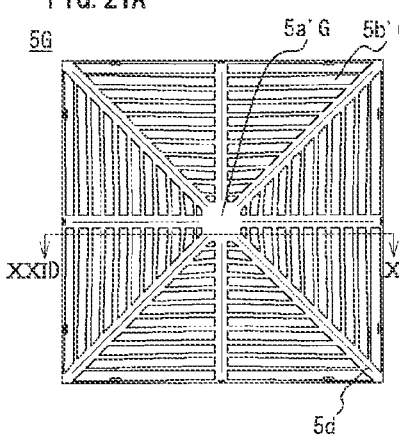
[FIG. 21]
Figure 21B:
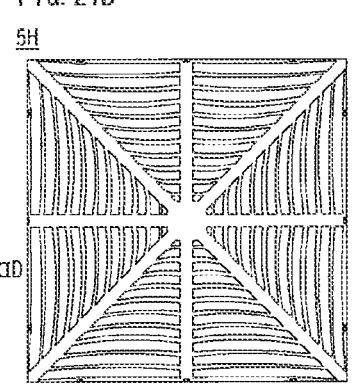
Figure 21C:
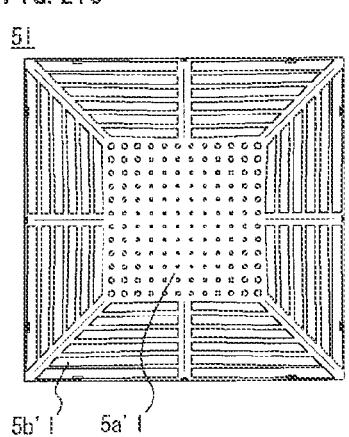
Figure 21D:

A surface illumination device according to an eighth embodiment of the present invention will be described with reference to FIG. 21. FIG. 21A is a plan view of a light transmitting/reflecting plate of the surface light source unit according to the eighth embodiment of the present invention. FIG. 21B and FIG. 21C are plan views of other examples of the light transmitting/reflecting plate according to the eighth embodiment of the present invention. FIG. 21D is a cross-sectional view taken along the line XXID-XXID in FIG. 21A. A surface light source unit used in the surface illumination device according to the eighth embodiment of the present invention is formed by partially changing the configuration of the surface light source unit according to the first embodiment of the present invention. In the description given below, portions same as those in the surface light source units 1 and 1A are denoted with the same reference numerals and overlapping description will be omitted. Different portions will be described in detail.

In a surface light source unit 1G of the eighth embodiment, while the ratio of the area of the mini-central reflecting section ΔS2 to the entire area S2 of the mini-light transmitting/reflecting plate 5G is a predetermined ratio, the shape of the opening is different from that in the mini-light transmitting/reflecting plate of the first embodiment. As illustrated in FIG. 21A, no opening is provided in a mini-central reflecting section 5a'G of the mini-light transmitting/reflecting plate 5G, and openings in a mini-outer reflecting section 5b'G have a form of a slit. As in the first embodiment, in the mini-outer reflecting section 5b'G of this embodiment, the slit has a narrow width so that the opening ratio is small at a portion near the center of the mini-light transmitting/reflecting plate 5G that is close to the LED 2 and receives light with high intensity, and the width of the slit at a peripheral portion that is far from the LED 2 and receives low intensity light is wide to increase the opening ratio. Thus, uniform illumination light can be obtained. Crosspieces provided between the slits are each provided with a groove, i.e., a so-called half cut 5d, that does not penetrate through the mini-light transmitting/reflecting plate 5G. Thus, brightness on the crosspiece can be adjusted.

According to an experiment, when the light transmitting/reflecting plate includes circular holes, a larger opening is directly related to a smaller amount of absorbed light, thereby improving the use efficiency of light. In contrast, when a slit is provided as an opening in an outer reflecting section, the opening ratio can be increased compared with a case where the circular opening is formed and thus, the use efficiency of light can be further improved.

As in a mini-light transmitting/reflecting plate 5H shown in FIG. 21B, the slit may have an arc shape instead of a linear shape. Direct light from a point light source is less likely to be emitted outside with the arc shape and thus the generation of glare can be prevented. Accordingly, more uniform light can be obtained. Furthermore, as in a mini-light transmitting/reflecting plate 5I shown in FIG. 21C, a central reflecting section 5a'I may be provided with circular holes, and an outer reflecting section 5b'I may be provided with slits. Furthermore, slits may be formed in a direction in which the direct light from the point light source is less likely to be emitted outside as illustrated in FIG. 21D instead of forming vertical slits on a light transmitting/reflecting plate. Thus, the direct light is less likely to be emitted outside, and the generation of glare can be more effectively prevented.

[Ninth Embodiment]

A surface light source unit according to a ninth embodiment of the present invention will be described with reference to FIG. 22. FIG. 22 is a cross-sectional view of the surface light source unit according to the ninth embodiment of the present invention. The surface light source unit used in a surface illumination device according to the ninth embodiment of the present invention is formed by partially changing the configuration of the surface light source unit according to the first embodiment of the present invention. In the description given below, portions same as those in the surface light source units 1 and 1A are denoted with the same reference numerals and overlapping description will be omitted. Different portions will be described in detail.

When a surface light source unit is reduced in size with the height of side plates being about 3 to 5 mm, there has been a problem that a color near a portion directly above a point light source is different from that in a peripheral area. This is assumed to be because illumination light near the portion directly above the corresponding point light source is mainly formed of light that has transmitted through a mini-light transmitting/reflecting plate, and illumination light at the peripheral portion is mainly formed of light that has transmitted through an opening formed in the mini-light transmitting/reflecting plate.

Figure 22A:
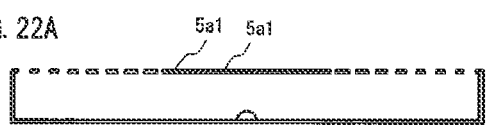
[FIG. 22]

As illustrated in FIG. 22A, in a surface light source unit 1J of the ninth embodiment, minute holes 5a1 having a diameter of 60 microns to 100 microns are formed in a central reflecting section around a portion in the mini-light transmitting/reflecting plate directly above the corresponding point light source. The minute hole can have any size as long as the hole is smaller than the mounted point light source. By forming the minute holes 5a1, the light from the point light source is emitted outside without transmitting through the mini-light transmitting/reflecting plate. Thus, fluctuation of the spectrum of light emitted through the central reflecting section can be prevented, and color temperature can be uniform over the entire area.

Figure 22D:
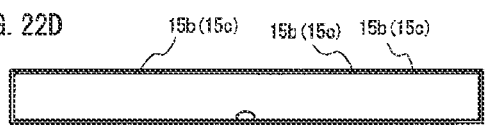
Figure 22B:
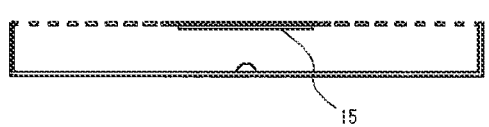

Furthermore, as illustrated in FIG. 22B, a high light reflectance member 15 may be provided, on the point light source 2 side of the central reflecting section around a portion directly above the point light source side in the mini-light transmitting/reflecting plate. By providing the high light reflectance member 15, the amount of light that transmits through the mini-light transmitting/reflecting plate becomes even smaller. Thus, the illumination light can have a uniform color temperature. The highly reflective member includes aluminum and a pure silver coating film. Furthermore, a light absorbing member that absorbs light in a certain wavelength may be provided instead of the high light reflectance member. In the present invention, the color changes to yellow. Thus, the illumination light can have uniform color temperature by providing a light absorbing member that absorbs a yellow wavelength.

Figure 22E:
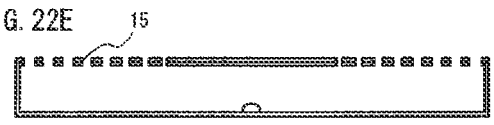
Figure 22C:
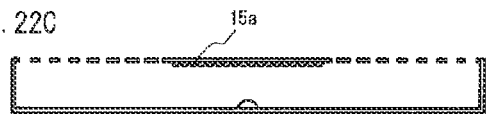

As illustrated in FIG. 22C, instead of the high light reflectance member, a plurality of protruding reflection members 15a may be formed. Furthermore, as illustrated in FIG. 22D, a diffusing member 15b or a micro-lens 15c may be provided in each opening formed in the mini-light transmitting/reflecting plate. Still furthermore, as illustrated in FIG. 22E, two overlapping layers of mini-light transmitting/reflecting plates may be provided and the high light reflectance member 15 having openings similar to those in the mini-light transmitting/reflecting plates may be sandwiched therebetween.

EXPLANATIONS OF LETTERS OR NUMERALS 1, 1A . . . surface light source unit, $1_{11}$ to $1_{22}$, $1A_{11}$ to $1A_{44}$ . . . mini-light source, 2 . . . LED (point light source), 3, 3A to 3D . . . housing, 3a, 3Aa, 3Ba, 3Da . . . bottom plate, 3b to 3e . . . side plate, 3f, 3f' . . . opening, $3_{11}$ to $3_{22}$, $3A_{11}$ to $3A_{44}$ . . . small chamber, 4 . . . partition plate, 5 . . . light transmitting/reflecting plate, $5_{11}$ to $5_{22}$, $5A_{11}$ to $5A_{44}$ . . . mini-light transmitting/reflecting plate (light transmitting/reflecting plate), 5a, 5a' . . . mini-central reflecting section (central reflecting section), 5b, 5b' . . . mini-outer reflecting section (outer reflecting section), 6 . . . diffusing plate, 7 . . . surface illumination, device, 8 . . . liquid crystal display panel, 9 . . . liquid crystal display device, 10, 10A to 10C . . . pillar, 11A to 11C . . . diffusing plate supporting member, 12 . . . frame, 13 . . . flame retardant coating, 14 . . . liquid flame retardant, φ1, φ2, φ3 . . . diameter

The invention claimed is:

1. A surface light source unit comprising:
a plurality of point light sources;
a bottom plate provided with the point light sources; and
a light transmitting/reflecting plate disposed apart from the bottom plate with a predetermined distance therebetween,
the point light sources being each arranged at a center portion of a corresponding one of a plurality of small chamber corresponding positions in the bottom plate,
the light transmitting/reflecting plate including a mini-light transmitting/reflecting plate region provided at each of the small chamber corresponding positions, having an area S, and including a central reflecting section disposed at a portion directly above the corresponding point light source and having high light reflectance, low light transmittance, and an area ΔS, and an outer reflecting section disposed on the periphery of the central reflecting section and having light transmittance increasing along with a distance from the central reflecting section,
wherein the predetermined distance ranges from 2 mm to 10 mm, and the ratio ΔS/S of the area ΔS to the area S ranges from 5% to 15%; and
wherein a pillar having a height larger than predetermined distance is formed on the bottom plate, and the light transmitting/reflecting plate is fixed to the pillar in such a manner that a distal end of the pillar protrudes to a certain height from the light transmitting/reflecting plate.

2. The surface light source unit according to claim 1, wherein the pillar has a spire cross shape, a tapered frustum shape, a tapered frustum with a protrusion, a cylindrical shape with a semispherical end, or a cylindrical shape with a semispherical end and window.

3. The surface light source unit according to claim 1, wherein the pillar is formed of a transparent material and has a cylindrical shape with a semispherical end or a cylindrical shape with a semispherical end and window, and the point light source is disposed inside the cylindrical shape of the pillar.

4. The surface light source unit according to claim 1, wherein an opening or a slit penetrating the light transmitting/reflecting plate is formed on the outer reflecting section.

5. The surface light source unit according to claim 1, wherein a minute hole smaller than the point light source is provided in the central reflecting section.

6. The surface light source unit according to claim 1, wherein a high light reflectance member is attached on the point light source side in the central reflecting section.

7. The surface light source unit according to claim 4, wherein a diffusion member or a micro-lens that diffuses light is provided in the opening or the slit.

8. The surface light source unit according to claim 1, wherein the light transmitting/reflecting plate is divided into pieces having a size large enough to cover the small chamber portions adjacent to each other.

9. The surface light source unit according to claim 1, wherein at least one of either the bottom plate or the light transmitting/reflecting plate is formed of an ultrafinely foamed light reflective material.

10. The surface light source unit according to claim 9, wherein the ultrafinely foamed light reflective material is provided with a flame retardant coating.

11. The surface light source unit according to claim 10, wherein the flame retardant coating is formed of paraxylylene or polyethylene terephthalate.

12. The surface light source unit according to claim 1, wherein the bottom plate is divided into small chamber portions having the same size by a partition plate, and the mini-light transmitting/reflecting plate region has the size same as that of each of the small chamber portions.

13. The surface light source unit according to claim 12, wherein the partition plate is shorter in height than a side wall of the surface light source unit.

14. The surface light source unit according to claim 12, wherein the bottom plate and the partition plate are joined by a quadric surface having a focus point on the point light source side.

15. The surface light source unit according to claim 12, wherein a light transmission hole or a notch groove through which light passes is provided on at least one of either the tight transmitting/reflecting plate or the partition plate at a portion at which the light transmitting/reflecting plate and the partition plate are in contact with each other or at a portion near the portion contact thereof.

16. The surface light source unit according to claim 14, wherein at least one of either the bottom plate, the partition plate, or the light transmitting/reflecting plate is formed of an ultrafinely foamed light reflective material.

17. The surface light source unit according to claim 16, wherein the ultrafinely foamed light reflective material is provided with a flame retardant coating.

18. The surface light source unit according to claim 17, wherein the flame retardant coating is formed of paraxylylene or polyethylene terephthalate.

19. A surface illumination device comprising a single unit or a plurality of units connected to each other of a surface light source unit, including at least one light source unit comprising:
a plurality of point light sources;
a bottom plate provided with the point light sources; and
a light transmitting/reflecting plate disposed apart from the bottom plate with a predetermined distance therebetween, the point light sources being each arranged at a center portion of a corresponding one of a plurality of small chamber corresponding positions in the bottom plate, the light transmitting/reflecting plate including a mini-light transmitting/reflecting plate region provided at each of the small chamber corresponding positions, having an area S, and including a central reflecting section disposed at a portion directly above the corresponding point light source and having high light reflectance, low light transmittance, and an area $\Delta S$, and an outer reflecting section disposed on periphery of the central reflecting section and having light transmittance increasing along with a distance from the central reflecting section, wherein the predetermined distance ranges from 2 mm to 10 mm, and the ratio $\Delta S/S$ of the area $\Delta S$ to the area S ranges from 5% to 15%; and wherein a pillar having a height larger than predetermined distance is formed on the bottom plate, and the light transmitting/reflecting plate is fixed to the pillar in such a manner that a distal end of the pillar protrudes to a certain height from the light transmitting/reflecting plate.

20. The surface illumination device according to claim 19, wherein a diffusing plate that transmits light is disposed above a light emitting surface of the light transmitting/reflecting plate.

21. The surface illumination device according to claim 20, wherein the diffusing plate has flame resistance.

22. A liquid crystal display device comprising the surface illumination device according to claim 19 provided on a rear surface of a liquid crystal display panel.

\* \* \* \* \*